(12) United States Patent
Ball

(10) Patent No.: US 7,528,328 B2
(45) Date of Patent: *May 5, 2009

(54) GASKETS FOR PROTECTING FINGERPRINT READERS FROM ELECTROSTATIC DISCHARGE SURGES

(75) Inventor: Shelby Ball, Frisco, TX (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/172,762

(22) Filed: Jul. 14, 2008

(65) Prior Publication Data

US 2008/0271916 A1    Nov. 6, 2008

Related U.S. Application Data

(63) Continuation of application No. 11/430,781, filed on May 9, 2006, now Pat. No. 7,399,931, and a continuation-in-part of application No. 29/255,900, filed on Mar. 13, 2006, said application No. 12/172,762 is a continuation-in-part of application No. 29/255,900, filed on Mar. 13, 2006.

(60) Provisional application No. 60/780,798, filed on Mar. 9, 2006.

(51) Int. Cl.
*H05K 9/00*    (2006.01)

(52) U.S. Cl. ................................ 174/355; 174/369

(58) Field of Classification Search .............. 174/355, 174/369, 371, 354; 277/920; 361/816, 818
See application file for complete search history.

(56) References Cited

U.S. PATENT DOCUMENTS

| | | |
|---|---|---|
| D194,373 S | 1/1963 | Long |
| D237,691 S | 11/1975 | Black |
| D238,662 S | 2/1976 | Black |
| D238,761 S | 2/1976 | Black |
| D238,762 S | 2/1976 | Black |
| D248,941 S | 8/1978 | Carlsson et al. |
| 4,425,168 A | 1/1984 | Goldstein et al. |
| 4,514,029 A | 4/1985 | Lax et al. |
| 4,832,466 A | 5/1989 | Nishimura et al. |
| 4,967,988 A | 11/1990 | Nguyen |
| D327,212 S | 6/1992 | Hubben et al. |
| 5,204,496 A | 4/1993 | Boulay et al. |
| D341,029 S | 11/1993 | Ilaria et al. |
| D359,442 S | 6/1995 | Johansson |
| D359,443 S | 6/1995 | Johansson |
| D359,444 S | 6/1995 | Johansson |
| 5,596,454 A | 1/1997 | Hebert |
| 5,753,315 A | 5/1998 | Minoura et al. |
| D409,079 S | 5/1999 | Sobczynski |

(Continued)

*Primary Examiner*—Hung V Ngo
(74) *Attorney, Agent, or Firm*—Harness, Dickey & Pierce, P.L.C.

(57) ABSTRACT

According to various aspects, exemplary embodiments are provided of gaskets that can protect fingerprint readers from receiving electrostatic discharge surges when a user's finger is placed in contact with the electronic scanning portion of the fingerprint reader. In exemplary embodiments, a gasket can provide an electrically-insulative barrier between the exposed contact points on the sides of the fingerprint reader, the electrostatic discharge, and the electrically-conductive side of the gasket. The gasket can also include an electrically-conductive side that provides a relatively short path to ground for the electrostatic discharge.

28 Claims, 22 Drawing Sheets

U.S. PATENT DOCUMENTS

| | | |
|---|---|---|
| 5,975,953 A | 11/1999 | Peterson |
| D429,725 S | 8/2000 | Morimiya |
| D440,145 S | 4/2001 | Wu et al. |
| D453,162 S | 1/2002 | Shim et al. |
| D457,708 S | 5/2002 | Holland |
| 6,388,877 B1 * | 5/2002 | Canova et al. ............... 361/686 |
| 6,420,009 B1 | 7/2002 | Cheng |
| D461,114 S | 8/2002 | Aubert Capella |
| D461,393 S | 8/2002 | Aubert Capella |
| 6,430,043 B1 | 8/2002 | Osburn |
| 6,501,018 B2 | 12/2002 | Mayer |
| D475,988 S | 6/2003 | Otani et al. |
| 6,624,432 B1 * | 9/2003 | Gabower et al. ......... 250/515.1 |
| 6,643,389 B1 | 11/2003 | Raynal et al. |
| D487,266 S | 3/2004 | Morimiya |
| D493,695 S | 8/2004 | Wengrower |
| 6,860,641 B1 | 3/2005 | Goldenbert et al. |
| 6,900,388 B2 | 5/2005 | Wang et al. |
| D508,198 S | 8/2005 | Holger |
| D508,245 S | 8/2005 | Ozolins et al. |
| D511,675 S | 11/2005 | Holger |
| 7,038,124 B1 | 5/2006 | Sosnowski |
| 7,077,696 B2 | 7/2006 | Haga et al. |
| 7,084,356 B2 | 8/2006 | English et al. |
| 7,104,843 B2 | 9/2006 | Olson et al. |
| D532,009 S | 11/2006 | Zank et al. |
| 7,168,971 B2 | 1/2007 | Manson et al. |
| D540,654 S | 4/2007 | Aubert Capella |
| D541,137 S | 4/2007 | Fabrizi |
| D542,627 S | 5/2007 | Rohmer et al. |
| 7,219,404 B2 | 5/2007 | Haga et al. |
| 7,238,048 B2 | 7/2007 | Olson et al. |
| 7,285,731 B2 | 10/2007 | Kohonen et al. |
| 7,285,732 B2 | 10/2007 | Vinokor et al. |
| 7,322,854 B2 | 1/2008 | Long et al. |
| 7,345,248 B2 | 3/2008 | Vinokor et al. |
| 2002/0030581 A1 | 3/2002 | Janiak et al. |
| 2002/0100598 A1 | 8/2002 | Mayer |
| 2004/0100874 A1 | 5/2004 | Chang et al. |
| 2004/0221494 A1 | 11/2004 | Santa Cruz |
| 2005/0121212 A1 | 6/2005 | English et al. |
| 2006/0093192 A1 | 5/2006 | Bechtel |
| 2007/0040810 A1 | 2/2007 | Dowe et al. |
| 2008/0060842 A1 | 3/2008 | Barringer et al. |

* cited by examiner

GASKETS FOR PROTECTING FINGERPRINT READERS FROM ELECTROSTATIC DISCHARGE SURGES

CROSS-REFERENCE TO RELATED APPLICATIONS

This application is a continuation of U.S. patent application Ser. No. 11/430,781 filed May 9, 2006 which, in turn, claims the benefit of U.S. Provisional Application 60/780,798 filed Mar. 9, 2006 and is also a continuation-in-part of United States Design Application 29/255,900 filed Mar. 13, 2006.

This application is a continuation-in-part of United States Design Application 29/255,900 filed Mar. 13, 2006.

The entire disclosures of the above applications are incorporated herein by reference in their entirety.

FIELD

The present disclosure generally relates (but not exclusively) to dual laminated gaskets capable of protecting fingerprint readers from receiving electrostatic discharge surges when a finger is placed in contact with the electronic scanning portion of the fingerprint reader.

BACKGROUND

The statements in this background section merely provide background information related to the present disclosure and may not constitute prior art.

Some electronic equipment includes electrical components and circuits mounted on a substrate that can be sensitive to electrostatic discharge surges, such as fingerprint readers. Fingerprint readers are devices that can be used for security purposes. For example, a laptop computer may be provided with a fingerprint reader for controlling access to the laptop computer. In such cases, a user may be required to first place his finger in contact with an electronic scanning portion of the fingerprint reader in order to gain authorization and access before using the laptop computer. But when the user's finger contacts the electronic scanning portion of the fingerprint reader, an electrostatic discharge (ESD) can be transmitted from the user to the fingerprint reader and printed circuit board. This electrostatic discharge surge can cause the printed circuit board to short out.

SUMMARY

According to various aspects, exemplary embodiments are provided of gaskets that can protect fingerprint readers from receiving electrostatic discharge surges when a user's finger is placed in contact with the electronic scanning portion of the fingerprint reader. In exemplary embodiments, a gasket can provide an electrically-insulative barrier between the exposed contact points on the sides of the fingerprint reader, the electrostatic discharge, and the electrically-conductive side of the gasket. The gasket can also include an electrically-conductive side that provides a relatively short path to ground for the electrostatic discharge.

In one particular exemplary embodiment, a gasket includes a lower surface having at least one portion that is electrically-conductive, an opening, and one or more flanges having one or more inner flange surfaces. At least one portion of the one or more inner flange surfaces is electrically non-conductive. The opening is configured to allow the gasket to be positioned generally about the electronic scanning portion of a fingerprint reader. A path to ground for the electrostatic discharge may be formed by the at least one electrically-conductive portion of the gasket's lower surface contacting a portion of the fingerprint reader. The at least one electrically non-conductive portion of the gasket's one or more inner flange surfaces may form an electrically-insulative barrier generally between the electronic scanning portion, the electrostatic discharge, and the at least one electrically-conductive portion of the gasket's lower surface.

Additional aspects relate to methods of making gaskets that can be used for protecting fingerprint readers from receiving an electrostatic discharge when a user's finger is placed in contact with an electronic scanning portion of the fingerprint reader. In one exemplary embodiment, a method generally includes applying an electrically non-conductive material to an electrically-conductive resilient material. The method may also include forming the electrically-conductive material with the electrically non-conductive material thereon to form a gasket. The resulting gasket may include a lower surface having at least one portion that is electrically-conductive, an opening, and one or more flanges having one or more inner flange surfaces that include at least one portion with the electrically non-conductive material.

Other aspects relate to methods of using gaskets to protect fingerprint readers from receiving electrostatic discharge surges when a user's finger is placed in contact with an electronic scanning portion of the fingerprint reader. In one exemplary embodiment, a method generally includes positioning a gasket generally about the electronic scanning portion. The gasket includes a lower surface having at least one portion that is electrically-conductive, an opening, and one or more flanges having one or more inner flange surfaces. At least one portion of the one or more inner flange surfaces is electrically non-conductive. In this particular method embodiment, positioning the gasket may include receiving the electronic scanning portion within the gasket's opening, forming a path to ground for the electrostatic discharge by contacting the at least one electrically-conductive portion of the gasket's lower surface with a portion of the fingerprint reader, and forming an electrically-insulative barrier, with the electrically non-conductive inner flange surfaces, generally between the electronic scanning portion, the electrostatic discharge, and the at least one electrically-conductive portion of the gasket's lower surface.

In another exemplary embodiment, a gasket generally includes a resilient member having an electrically-conductive lower surface, an opening, and one or more flanges extending generally upwardly relative to the electrically-conductive lower surface about the opening. The one or more flanges include one or more electrically non-conductive inner flange surfaces. The opening is configured to allow the gasket to be positioned generally about a portion of an electronic device with a path to ground for an electrostatic discharge being formed by the gasket's electrically-conductive lower surface contacting a portion of the electronic device, and with the electrically non-conductive inner flange surfaces forming an electrically-insulative barrier generally between the portion of the electronic device about which the gasket is positioned, the electrostatic discharge, and the gasket's electrically-conductive lower surface.

Further aspects and features of the present disclosure will become apparent from the detailed description provided hereinafter. In addition, any one or more aspects of the present disclosure may be implemented individually or in any combination with any one or more of the other aspects of the present disclosure. It should be understood that the detailed description and specific examples, while indicating exemplary embodiments of the present disclosure, are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

Figure 1:
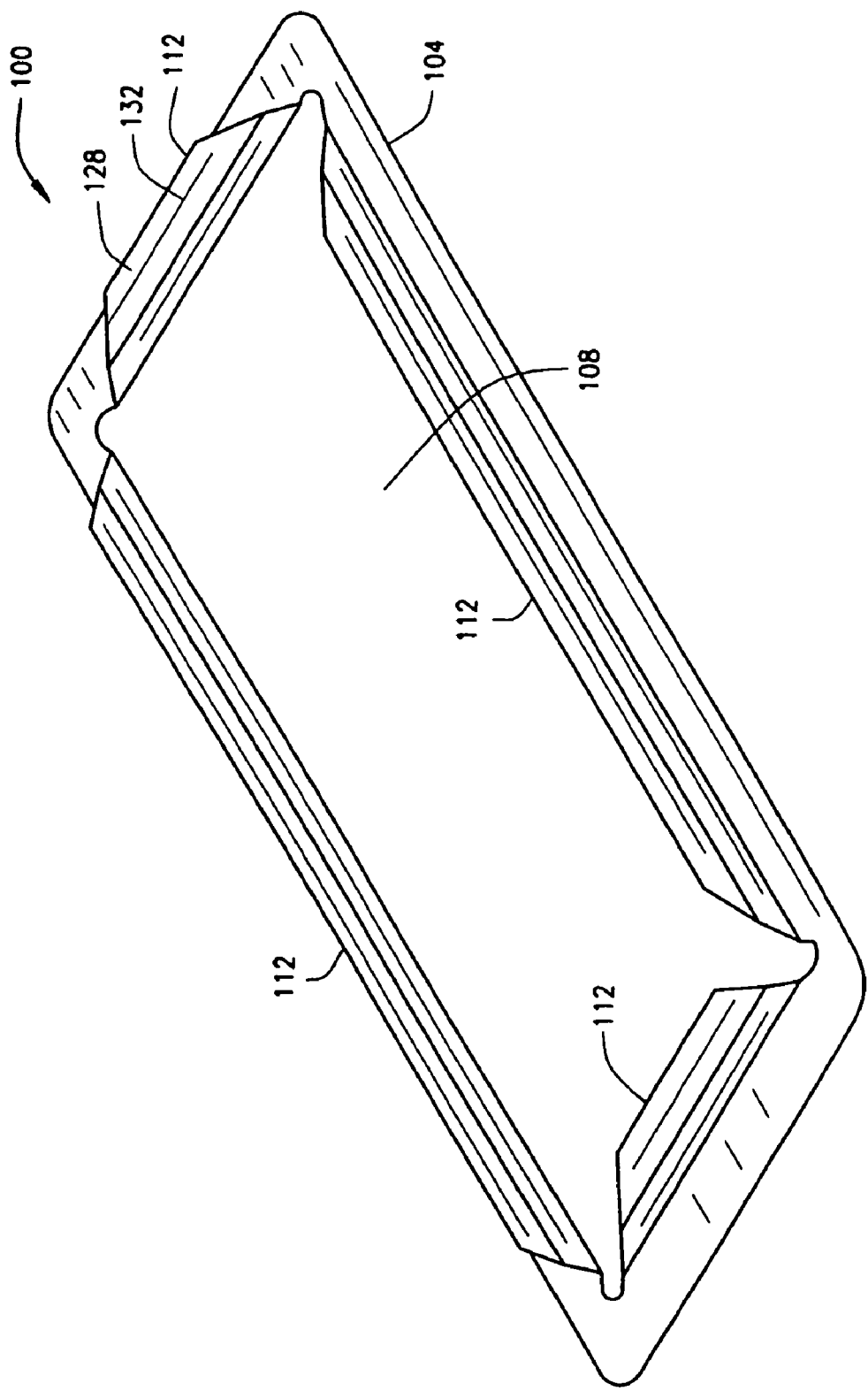
FIG. 1 is a perspective view of a gasket capable of protecting a fingerprint reader from receiving an electrostatic discharge surge when a user's finger is placed in contact with the electronic scanning portion of the fingerprint reader according to one exemplary embodiment.

The following description is merely exemplary in nature and is in no way intended to limit the present disclosure, application, or uses.

When a user places his finger in contact with an electronic scanning portion of a fingerprint reader, an electrostatic discharge (ESD) can be transmitted from the user to the fingerprint reader and printed circuit board. This electrostatic discharge surge can cause the printed circuit board to short out and the fingerprint reader to malfunction. To overcome this problem, the inventor hereof has developed gaskets that can be used with fingerprint readers. When a gasket is installed, the installed gasket can protect a fingerprint reader from receiving an electrostatic discharge surge when the user places his finger in contact with the electronic scanning portion of a fingerprint reader. In such embodiments, a gasket can provide an electrically-insulative barrier between the exposed contact points on the sides of the fingerprint reader, the electrostatic discharge, and the electrically-conductive side of the gasket. The installed gasket can also include an electrically-conductive side that provides a relatively short path to ground for the electrostatic discharge.

Further aspects relate to methods of using gaskets with fingerprint readers (or other electronic equipment) to protect the fingerprint reader from receiving an electrostatic discharge surge when a user's finger is placed in contact (e.g., pressed, swiped, rubbed, etc.) with the electronic scanning portion of the fingerprint reader (or other touch-screen sensor device, etc.). Additional aspects relate to methods of making gaskets, such as dual laminated gaskets useful for protecting fingerprint readers from receiving an electrostatic discharge surge when a user's finger is placed in contact with the electronic scanning portion of a fingerprint reader (or other electronic device). Still other aspects relate to fingerprint readers having gaskets, where the gaskets can protect the fingerprint reader from receiving an electrostatic discharge surge when a user's finger is placed in contact with the electronic scanning portion of the fingerprint reader. In addition, any one or more aspects of the present disclosure may be implemented individually or in any combination with any one or more of the other aspects of the present disclosure.

In various embodiments, a gasket is formed from beryllium copper alloy or other suitable resilient or springy electrically-conductive materials. An electrically non-conductive material (e.g., Mylar® films, polyester films, synthetic films, other suitable electrically non-conductive films and materials, etc.) can then be laminated to portions of the resilient electrically-conductive material (e.g., prior to stamping or forming the gasket, etc.). The electrically-conductive material can be bonded to the electrically non-conductive material via adhesive or by other suitable means. Accordingly, this gasket can be used with a fingerprint reader for protecting the fingerprint reader from receiving an electrostatic discharge surge when a user's finger is placed in contact with the scanning surface of the fingerprint reader. This protection can be accomplished by the gasket providing a path to ground on one side of the gasket (via the electrically-conductive material), while the opposite or other side of the gasket is providing an electrically-insulative barrier (via the electrically non-conductive material).

Other embodiments include a gasket formed from beryllium copper alloy or other suitable resilient or springy electrically-conductive material. An electrically non-conductive paint can be applied or coated onto portions of the resilient electrically-conductive material (e.g., prior to stamping or forming the gasket, etc.). Accordingly, this gasket can be used with a fingerprint reader for protecting the fingerprint reader from receiving an electrostatic discharge surge when a user's finger is placed in contact with the scanning surface of the fingerprint reader. This protection can be accomplished by the gasket providing a path to ground on one side of the gasket (via the electrically-conductive material), while the opposite or other side of the gasket is providing an electrically-insulative barrier (via the electrically non-conductive paint).

Further embodiments include a gasket formed from beryllium copper alloy or other suitable resilient or springy electrically-conductive material. An electrically non-conductive spray (e.g., an electrically non-conductive polytetrafluoroethylene (PFTE) or Teflon® spray, etc.) can be applied, coated, or sprayed onto portions of the resilient electrically-conductive material (e.g., prior to stamping or forming the gasket, etc.). Accordingly, this gasket can be used with a fingerprint reader for protecting the fingerprint reader from receiving an electrostatic discharge surge when a user's finger is placed in contact with the scanning surface of the fingerprint reader. This protection can be accomplished by the gasket providing a path to ground on one side of the gasket (via the electrically-conductive material), while the opposite or other side of the gasket is providing an electrically-insulative barrier (via the electrically non-conductive paint).

Figure 2:
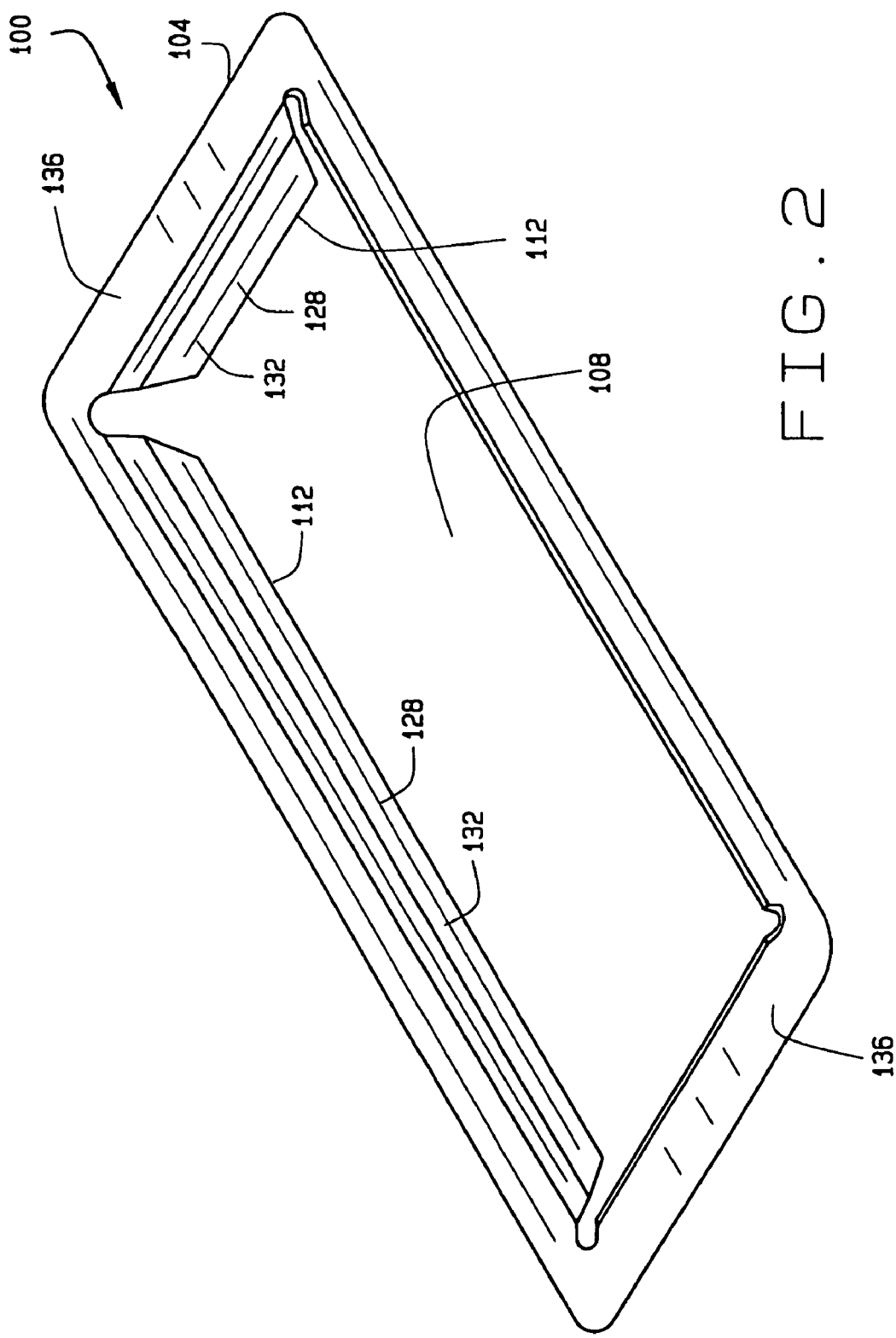
FIG. 2 is a lower perspective view of the gasket shown in FIG. 1
Figure 3:
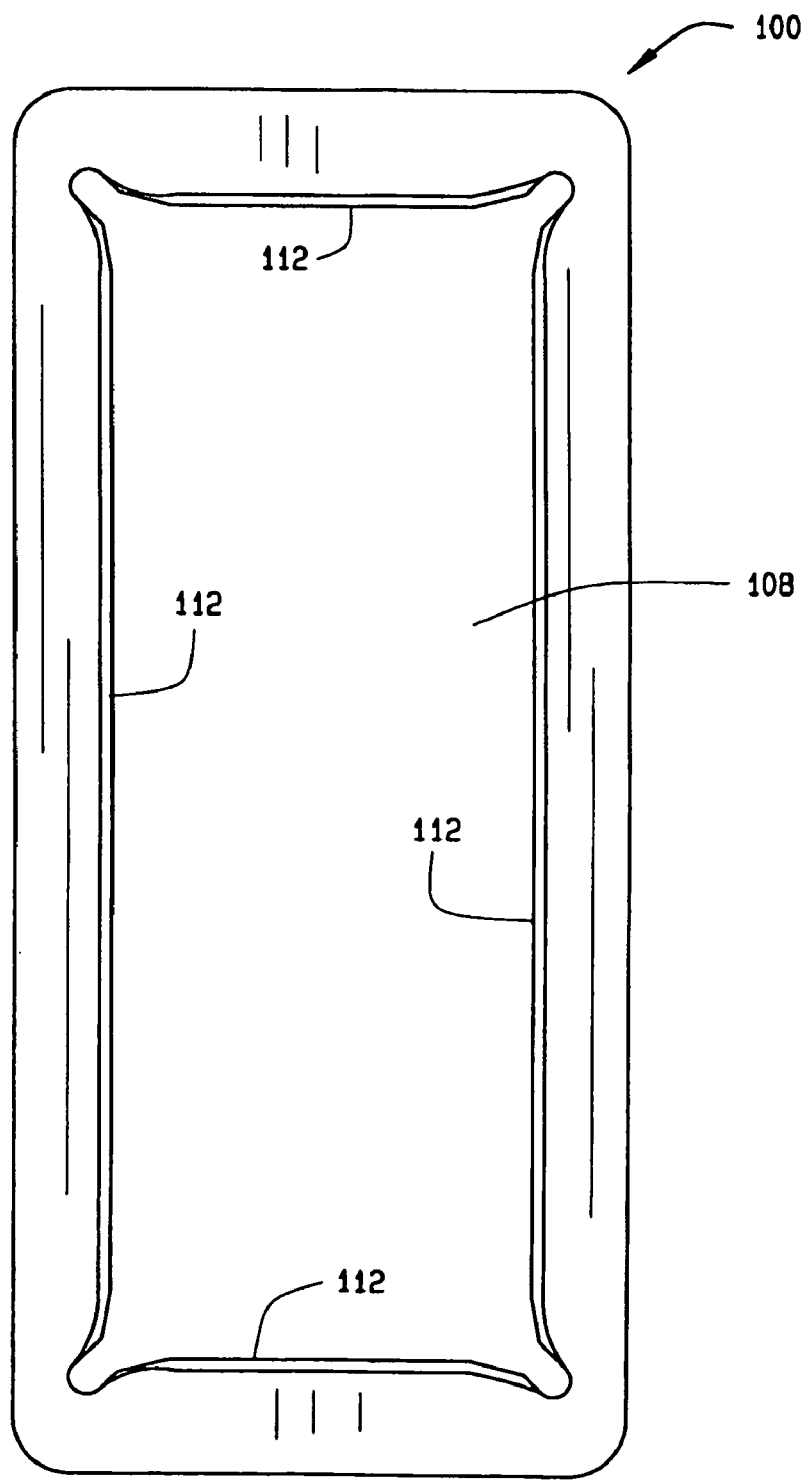
FIG. 3 is an upper plan view of the gasket shown in FIG. 1.

FIGS. 1 through 6 illustrate an exemplary gasket 100 embodying one or more aspects of the present disclosure. As shown in FIG. 1, the gasket 100 generally includes an annular member 104 having an opening or window 108 therethrough. Flanges 112 extend generally upwardly about the opening 108. While the member 104 and window 108 are generally rectangular in this embodiment, other configurations (e.g., shapes, sizes, etc.) are also possible for the member 104 and window 108. FIG. 2 is a lower perspective view of the gasket 100 further illustrating the flanged interior surfaces of the gasket 100.

Figure 7:
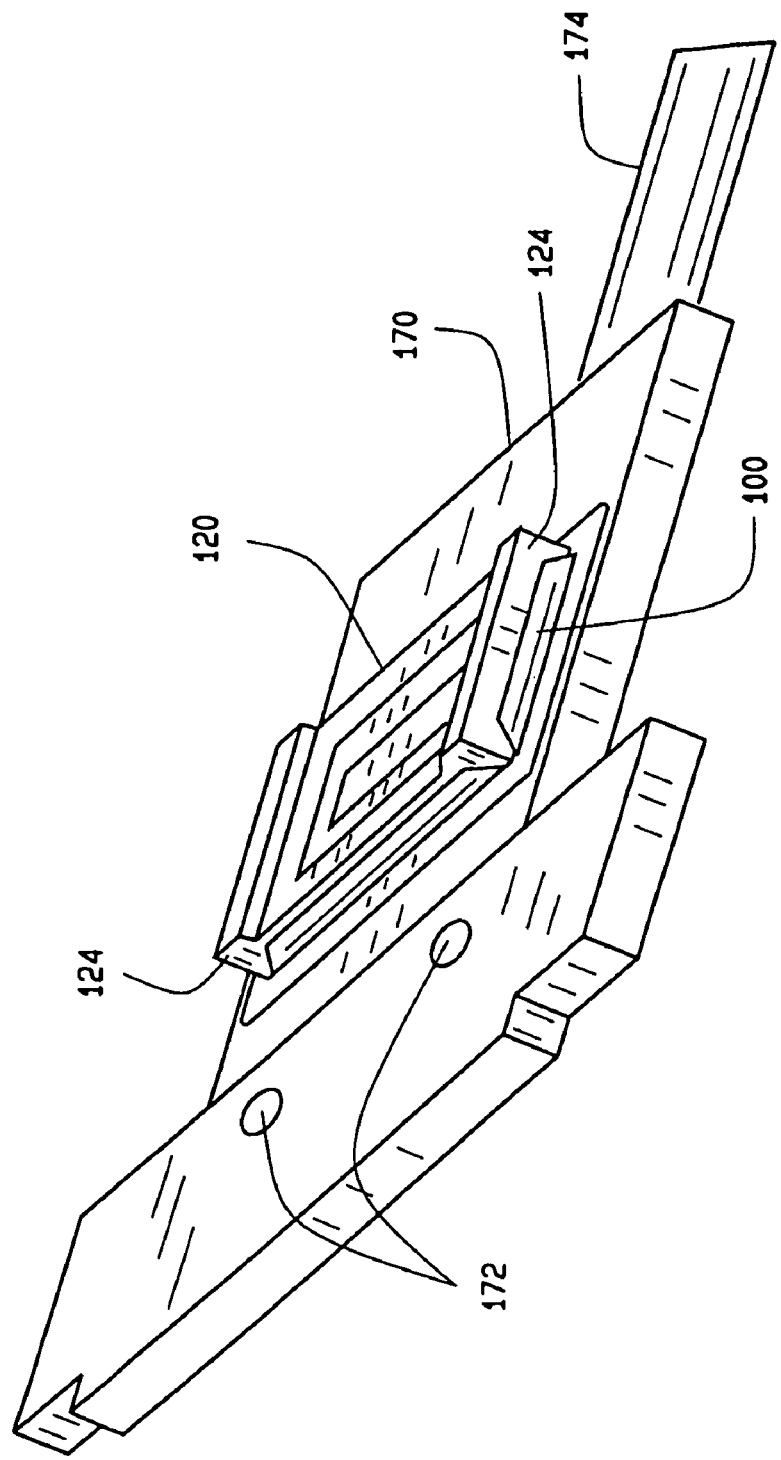
FIG. 7 is a perspective view of the gasket shown in FIG. 1 installed on an electronic scanning portion of a fingerprint reader with the gasket's electrically-conductive portion providing a path to ground, and with the gasket's electrically non-conductive laminated portion providing an electrically-insulative barrier according to exemplary embodiments.
Figure 8:
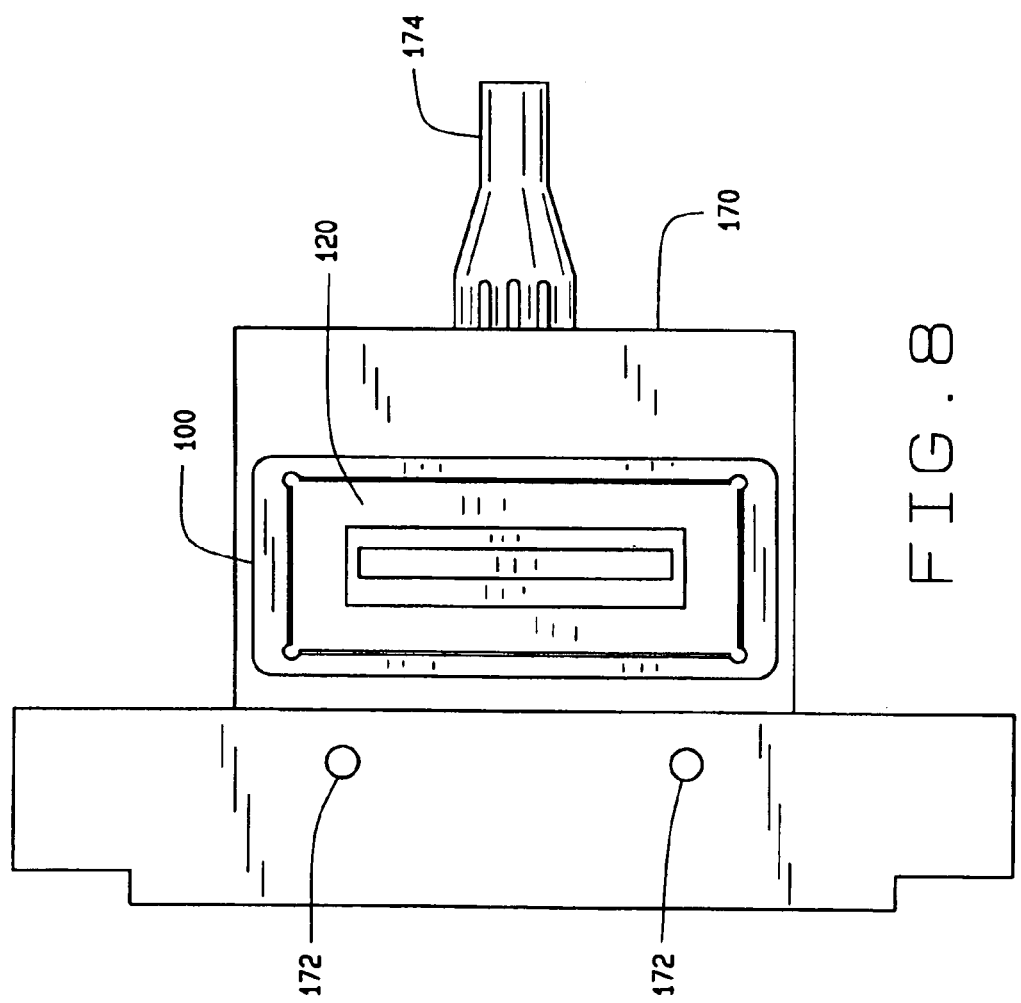
FIG. 8 is an upper plan view of the gasket and the fingerprint reader portion shown in FIG. 7.
Figure 9:
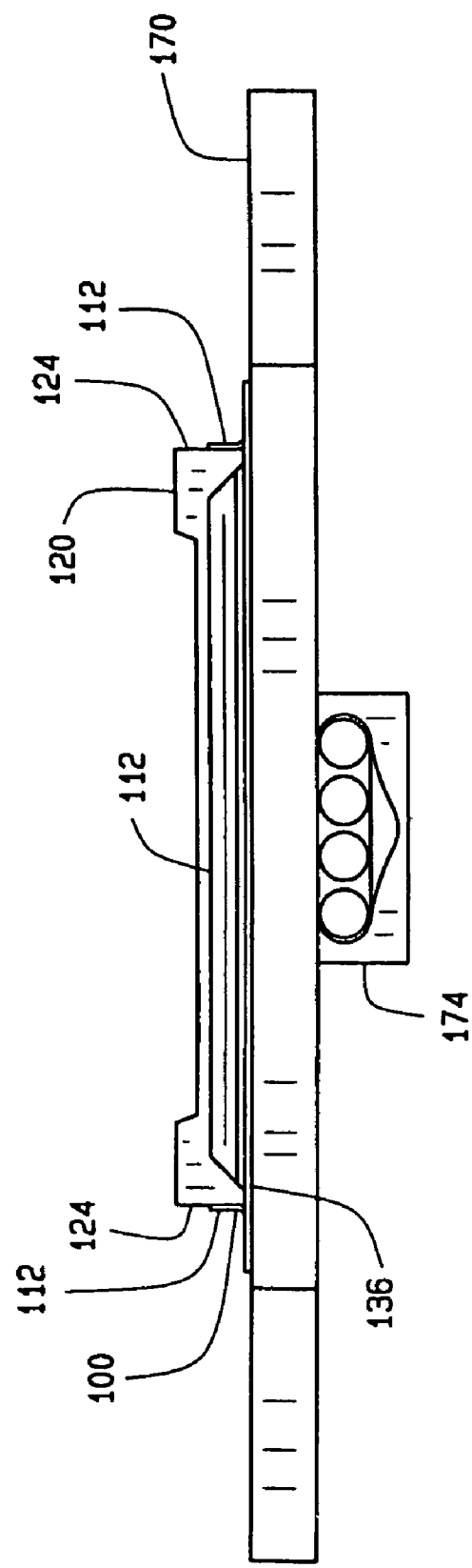
FIG. 9 is a front elevation view of the gasket and the fingerprint reader portion shown in FIG. 7.
Figure 10:
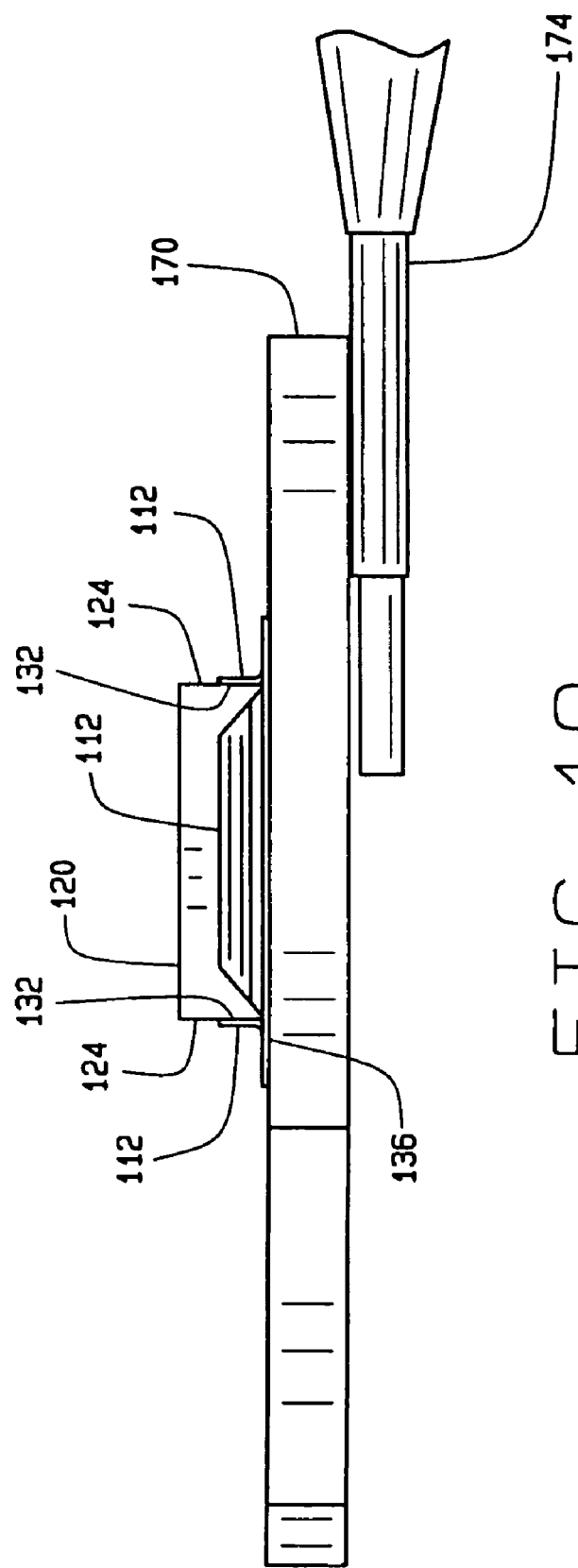
FIG. 10 is a side elevation view of the gasket and the fingerprint reader portion shown in FIG. 7.

A wide range of materials can be used for the member 104, preferably electrically-conductive materials having sufficient resiliency or springiness for permitting the flanges 112 to be at least partially deflected during use. For example, this resiliency can allow the flanges 112 to deflect or flex outwardly, and then to respond with a sufficient restorative force for biasing the flanges 112 against sidewalls 124 of the fingerprint reader electronic scanning portion 120, as shown in FIGS. 7, 9, and 10). This biasing force can help the flanges 112 maintain good contact with the fingerprint reader's sidewalls 124. Accordingly, the selection of the material for the member 104 and/or the flanges 112 can depend, for example, on the particular application and the deflection needs for maintaining good contact against the fingerprint reader.

In the illustrated embodiment, the member 104 is formed from a beryllium copper alloy. Alternatively, other suitable resilient or springy electrically-conductive materials can be used for the member 104.

The gasket 100 further includes an electrically non-conductive material 128 laminated to the inner surfaces 132 of the flanges 112. A wide range of electrically non-conductive materials can be laminated to the member 104, such as Mylar® films, polyester films, synthetic films, among other suitable electrically non-conductive films and materials, etc. In one particular embodiment, an electrically non-conductive Mylar® (tape-to-tape) product is laminated to the inner surfaces 132 of the flanges 112. Alternative embodiments can use other suitable electrically non-conductive materials.

With continued reference to FIGS. 1 through 6, the electrically non-conductive material 128 can be bonded to the electrically-conductive member 104 via pressure sensitive adhesive. In some embodiments, adhesive is disposed only at the interfaces or between opposing surfaces of the electrically non-conductive material 128 and the electrically-conductive member 104, such that no adhesive is needed or used on any other portion of the gasket 100. In other embodiments, however, adhesive may be provided at other locations depending, for example, on the particular application. In addition, other suitable means can also be employed for bonding or attaching the electrically non-conductive material 128 to the electrically-conductive member 104.

An exemplary method of making the gasket 100 will now be described for purposes of illustration only. In this example, an electrically non-conductive Mylar® film with pressure sensitive adhesive is laminated to the electrically-conductive material prior to stamping and forming the gasket 100. In this particular example, the Mylar® tape-to-tape product having a thickness (combined Mylar® and adhesive thickness) of about ten microns can be laminated to beryllium copper alloy, which has a thickness of about 0.002 inch. The Mylar® tape-to-tape product is preferably laminated at only those particular locations that will ultimately form the inner surfaces 132 of the flanges 112. The member 104 can then be formed by stamping the electrically-conductive material with the electrically non-conductive Mylar® material 128 laminated thereon. For this example, the use of beryllium copper alloy can be advantageous in that it allows the gasket 100 to be formed without requiring any post heat treatment processing. In addition, the selection of Mylar® film with adhesive may be advantageous because it can be sprayed on, generally has excellent dielectric or electrically non-conductive properties, can act as a lubricant for forming operations, can withstand forming operations, and can be generally less costly than other materials. Alternatively, the gasket 100 can be made from other electrically-conductive materials, from other electrically non-conductive materials, with other bonding means, and/or by using other manufacturing methods besides laminating, stamping, and forming.

Figure 4:
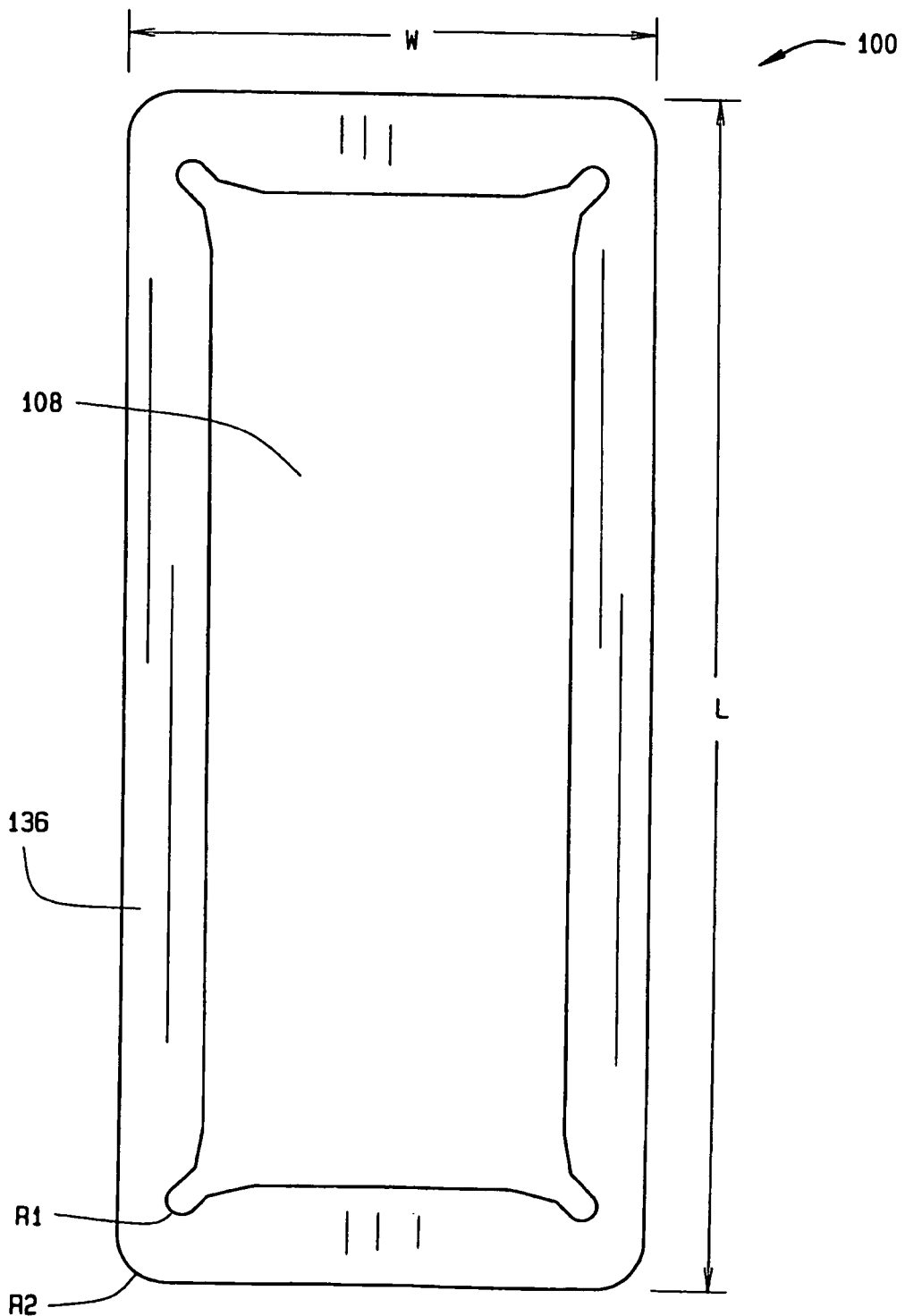
FIG. 4 is a lower plan view of the gasket shown in FIG. 1.
Figure 5:
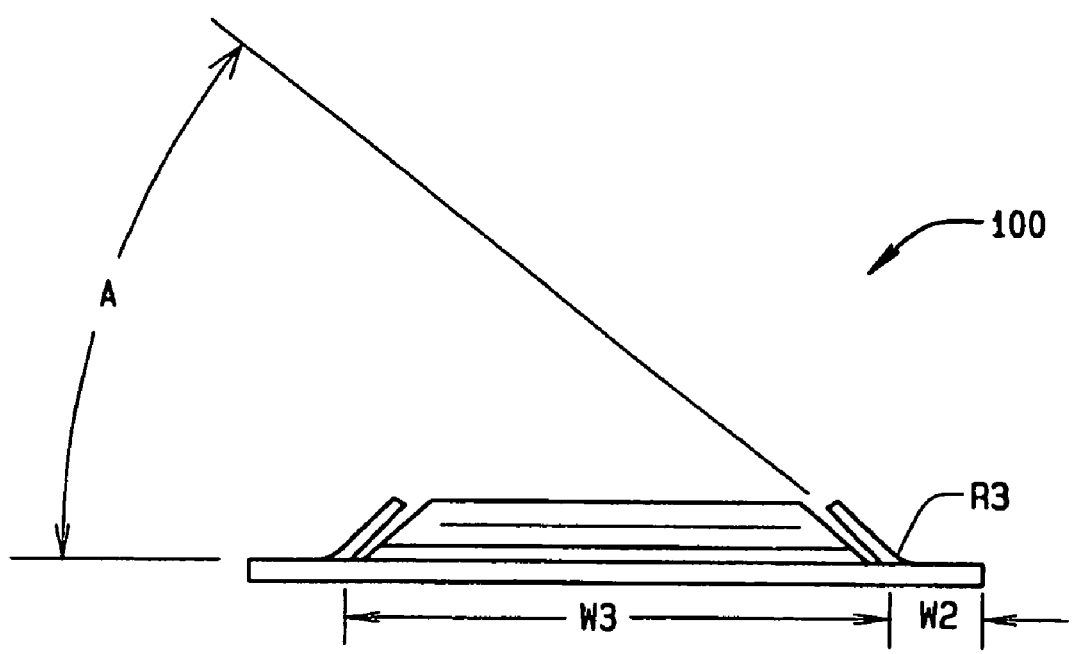
FIG. 5 is a front elevation view of the gasket shown in FIG. 1.
Figure 6:
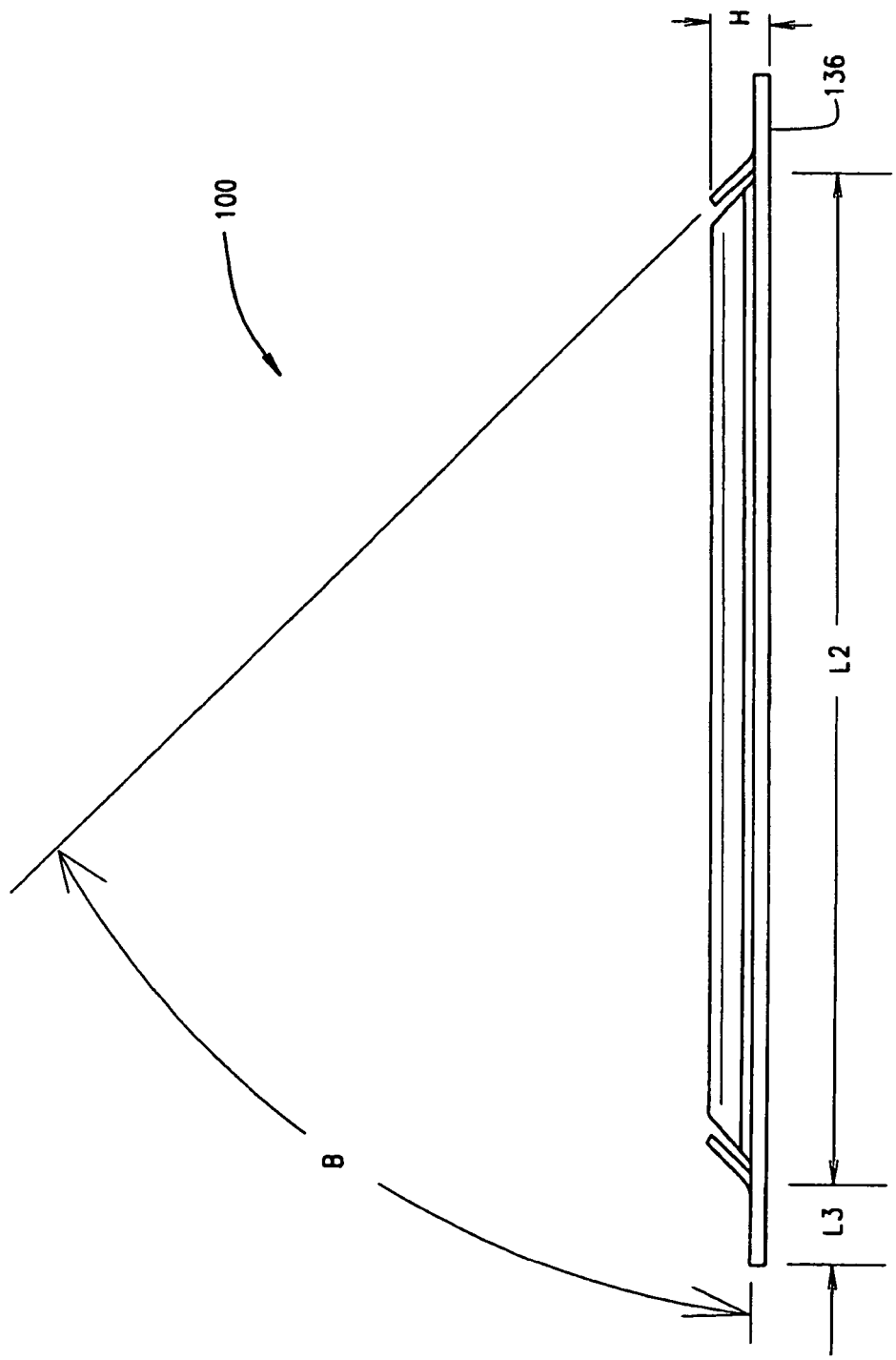
FIG. 6 is a side elevation view of the gasket shown in FIG. 1.

In order to further illustrate various aspects, the following example is given for purposes of illustration only and not for purposes of limitation. With reference to FIG. 4, the gasket 100 can have a length L of about 0.65 inch, a width W of about 0.28 inch, a radius of curvature R1 of about 0.008 inch, and a radius of curvature R2 of about 0.02 inch. With reference to FIG. 5, the gasket 100 can have an angle A of about seventy-five degrees, a width W2 of about 0.202 inch, a width W3 of about 0.04 inch, and a radius of curvature R3 of about 0.008 inches. With reference to FIG. 6, the gasket 100 can have a height H of about 0.028 inch, a length L2 of about 0.548 inch, a length L3 of about 0.05 inch, and an angle B of about seventy-five degrees. The dimensions and angular values provided in this paragraph (as are all dimensions and angular values set forth herein) are for purposes of illustration only, as the gasket 100 can be configured with different dimensions and angles depending, for example, on the particular device in which the gasket 100 will be used.

With reference now to FIGS. 7 through 10, a description will now be provided of an exemplary use of a gasket (e.g., 100, 200, 300, etc.). In this particular example, the gasket 100 is illustrated being used with a fingerprint reader. Various aspects of the present disclosure, however, can also be used with other electronic equipment besides fingerprint readers (e.g., wireless portable data entry devices having touch-screen input interfaces, bank terminal touch screens, etc.). Accordingly, the specific references to fingerprint readers should not be construed as limiting the scope of the invention to use with only fingerprint readers.

As shown in FIGS. 7 through 10, the fingerprint reader generally includes a board 170 (e.g., printed circuit board, etc.) having holes 172 for mechanical fasteners (e.g., screws, etc.) for mounting the board 170 within an electronic device housing, for example, An electronic scanning portion 120 is shown mounted to the board 170. During use, a user places a finger in contact with the upper surface of the electronic scanning portion 120, to thereby allow reading/scanning of the user's fingerprint. A cord 174 is also shown that can provide power and/or data transfer. For example, the cord 174 may allow for data transfers to/from the electronic scanning portion 120 and other board-mounted components (if any). By way of example, the cord 174 may allow data to be transferred to a computer (or other device) that will ultimately interpret the data obtained from the fingerprint reader by the electronic scanning portion 120. As another example, the cord 174 may also allow data transfer from the electronic scanning portion 120 (and other board-mounted components) to another device, for example, such as a security device that is unlocked when the proper fingerprint data is received.

As shown in FIGS. 9 and 10, the gasket 100 can be positioned with the electrically-conductive lower surface 136 in contact with the board 170, thereby providing an electrostatic discharge path to ground. The inner surfaces 132 of the gasket flanges 112 are shown positioned abutting against the sidewalls 124 of the fingerprint reader electronic scanning portion 120. As described herein, the inner surfaces 132 of the gasket flanges 112 include electrically non-conductive Mylar® material 128 thereon. Accordingly, the electrically non-conductive Mylar® material 128 on the inner flange surfaces 132 can thus provide an electrically-insulative barrier. In this exemplary manner, the gasket 100 can thus protect the fingerprint reader from receiving an electrostatic discharge surge when the user's finger is placed in contact with the scanning surface of the fingerprint reader.

Figure 11:
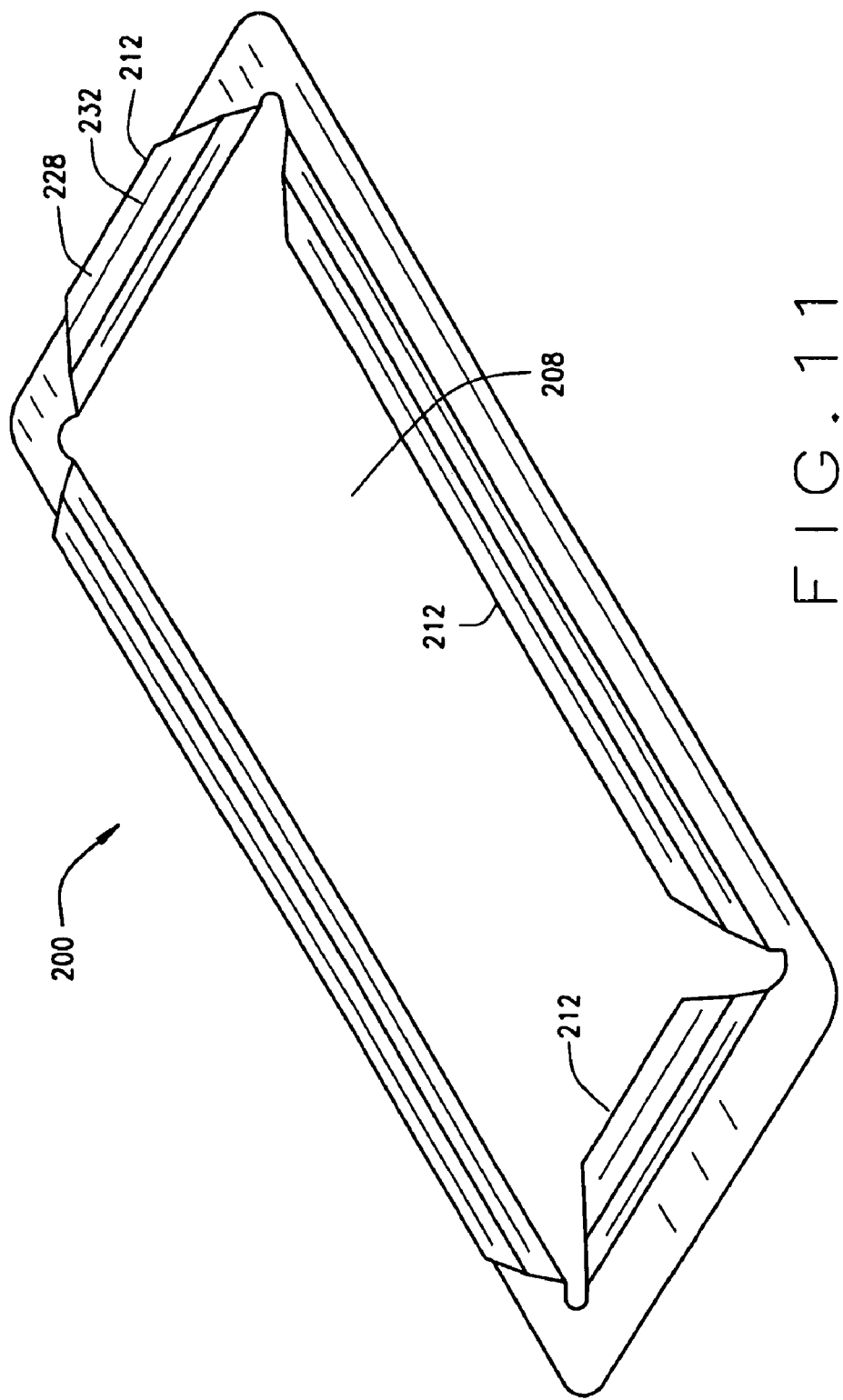
FIG. 11 is a perspective view of another exemplary embodiment of a gasket capable of protecting a fingerprint reader from receiving an electrostatic discharge surge when a user's finger is placed in contact with the electronic scanning portion of the fingerprint reader.
Figure 12:
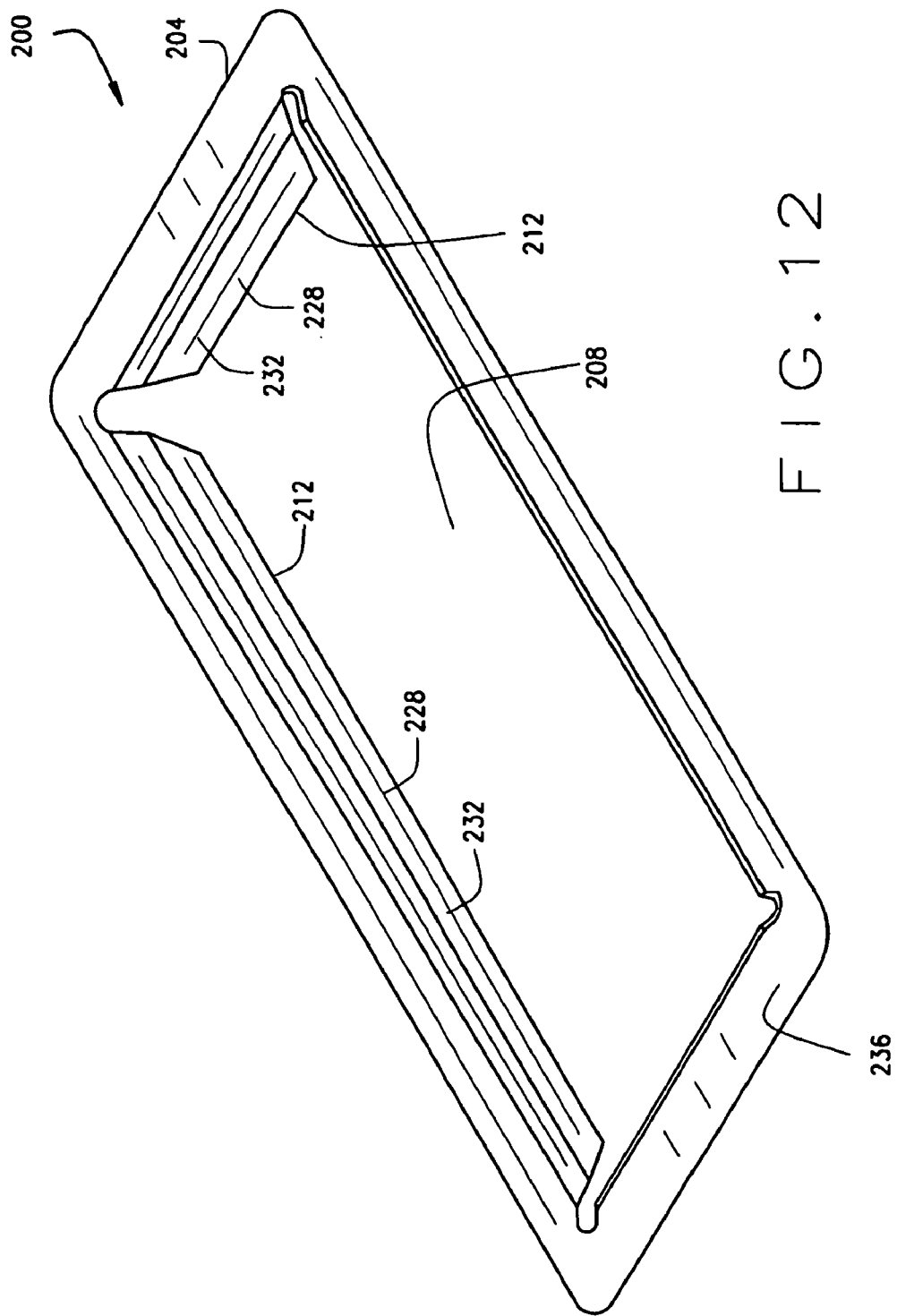
FIG. 12 is a lower perspective view of the gasket shown in FIG. 11.
Figure 13:
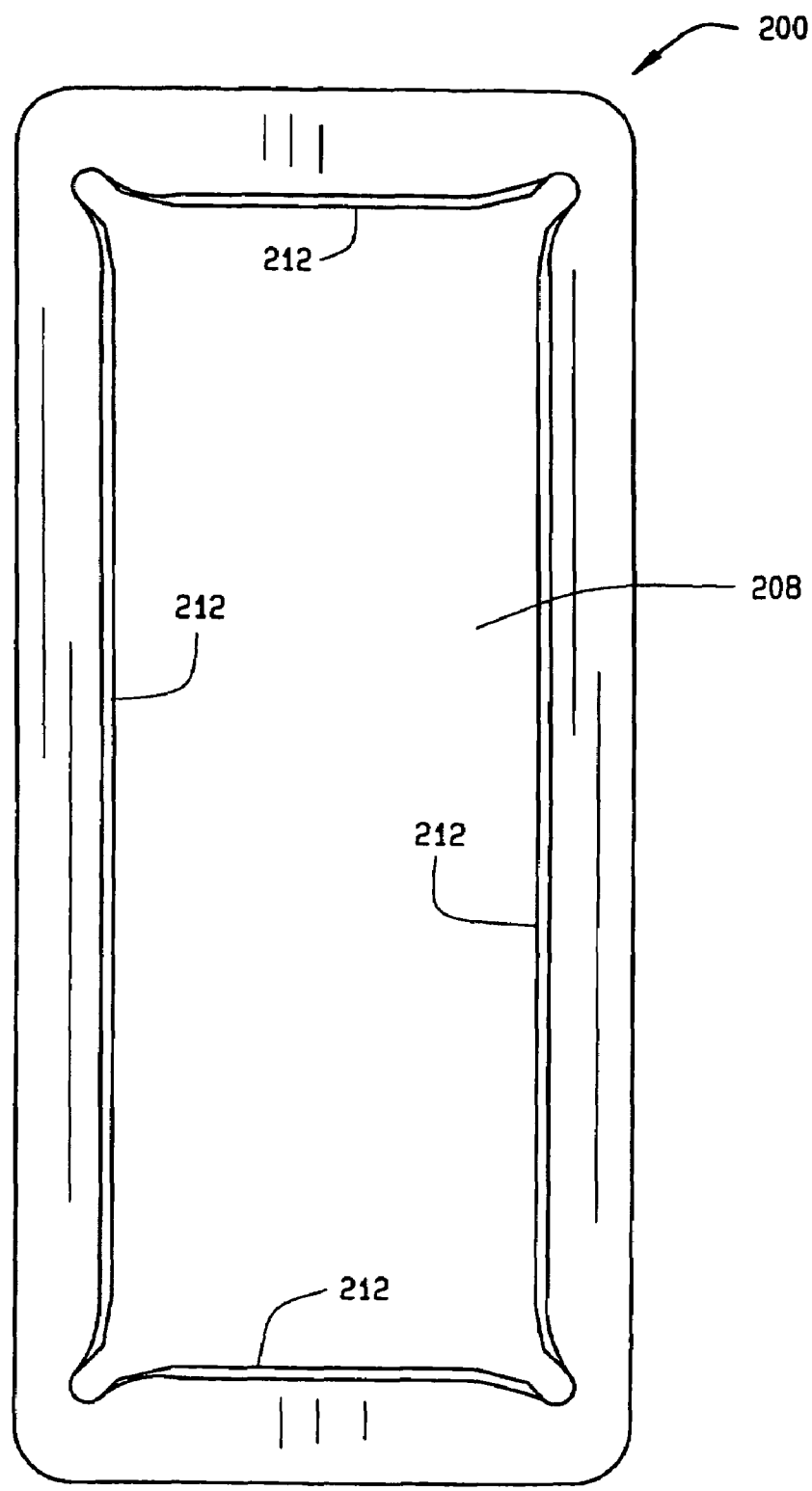
FIG. 13 is an upper plan view of the gasket shown in FIG. 11.
Figure 14:
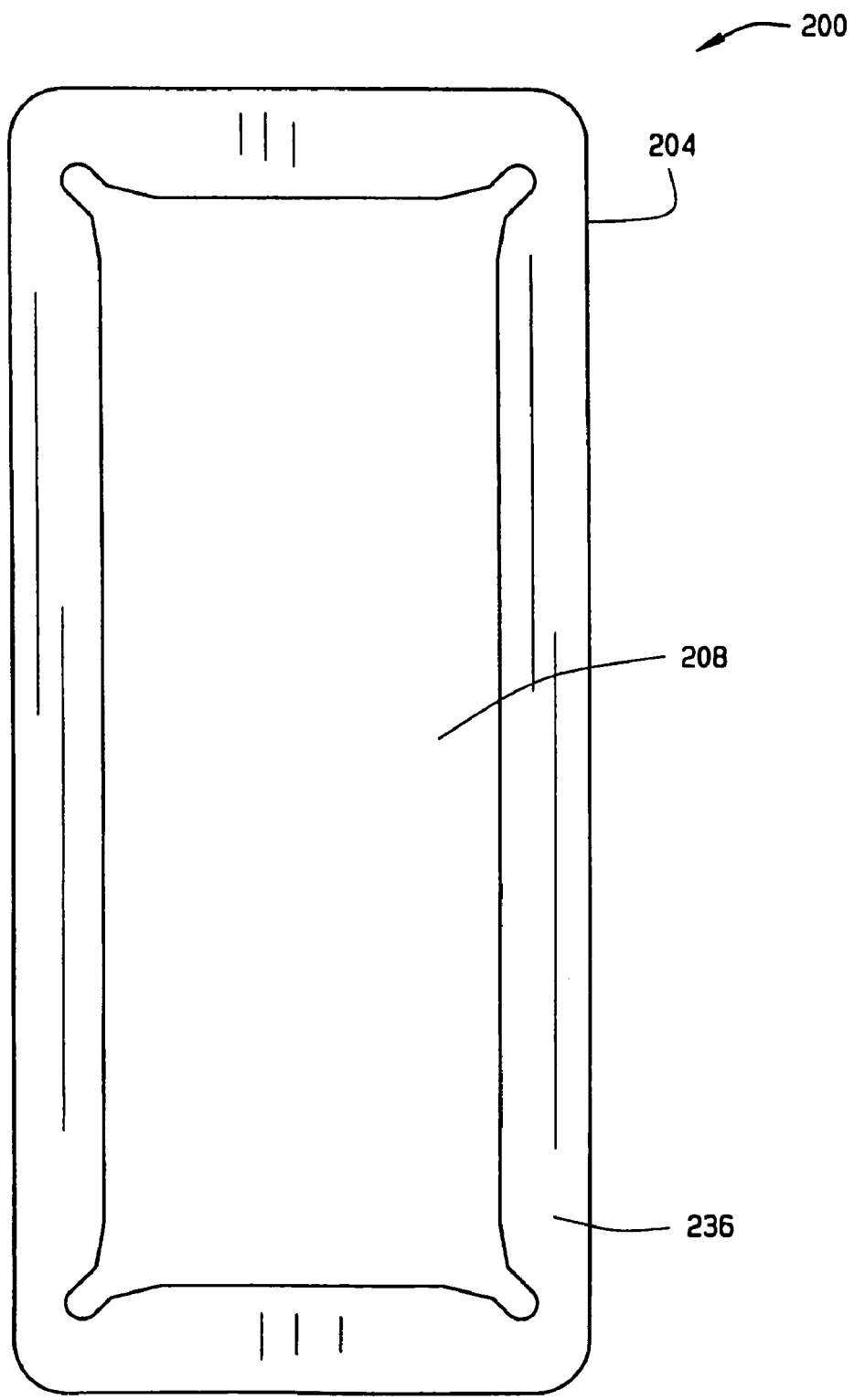
FIG. 14 is a lower plan view of the gasket shown in FIG. 11.
Figure 15:
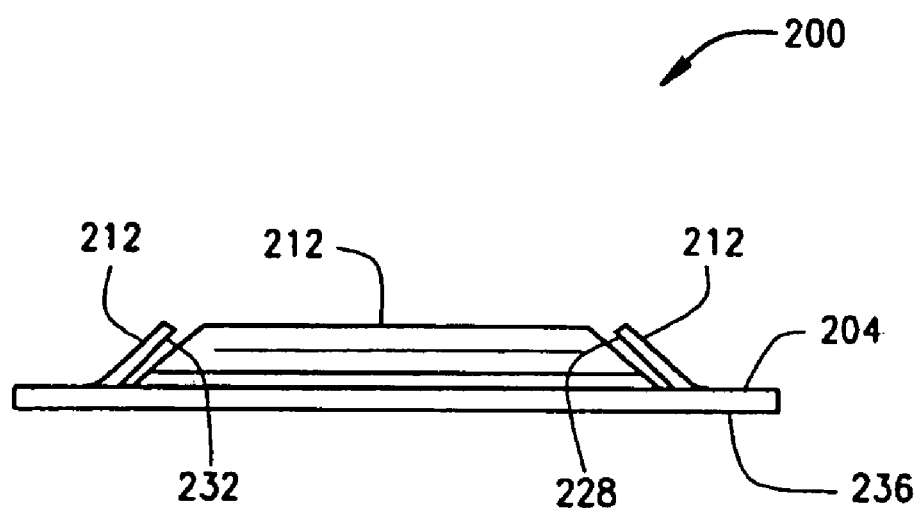
FIG. 15 is a front elevation view of the gasket shown in FIG. 11.
Figure 16:
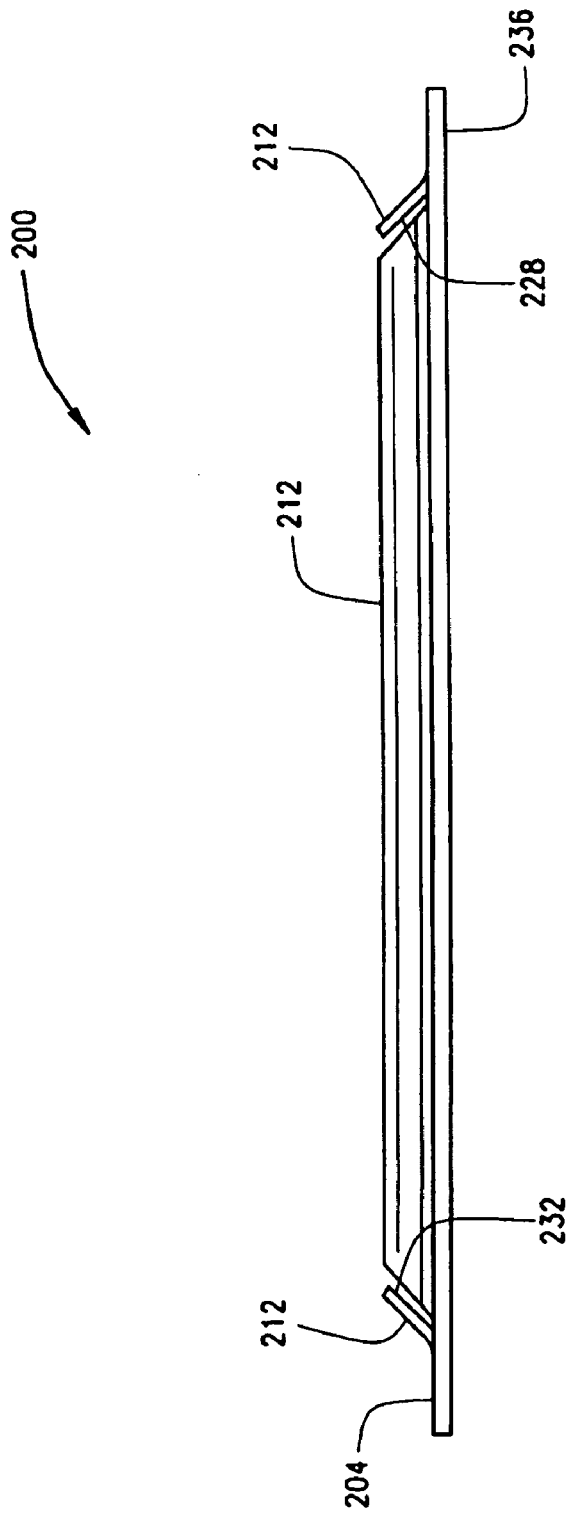
FIG. 16 is a side elevation view of the gasket shown in FIG. 11.

FIGS. 11 through 16 illustrate another exemplary embodiment of a gasket 200 embodying one or more aspects of the present disclosure. As shown in FIG. 11, the gasket 200 generally includes a member 204 having a window 208 therethrough. Flanges 212 extend generally upwardly about the opening 208. While the member 204 and window 208 are generally rectangular in this embodiment, other configurations (e.g., shapes, sizes, etc.) are also possible for the member 204 and window 208. FIG. 12 is a lower perspective view of the gasket 200 further illustrating the flanged interior surfaces of the gasket 200.

A wide range of materials can be used for the member 204, preferably electrically-conductive materials having sufficient resiliency or springiness for permitting the flanges 212 to be at least partially deflected during use. For example, this resiliency can allow the flanges 212 to deflect or flex outwardly, and then to respond with a sufficient restorative force for biasing the flanges 212 against a portion of the fingerprint reader (e.g., sidewalls 124 of the fingerprint reader electronic scanning portion 120, as shown in FIGS. 7, 9, and 10). This biasing force can help the flanges 212 maintain good contact with the fingerprint reader's sidewalls. Accordingly, the selection of the material for the member 204 and/or the flanges 212 can depend, for example, on the particular application and the deflection needs for maintaining good contact against the fingerprint reader.

In the illustrated embodiment, the member 204 is formed from a beryllium copper alloy. Alternatively, other suitable resilient or springy electrically-conductive materials can be used for the member 204.

The gasket 200 further includes an electrically non-conductive coating 228 applied to the inner surface portions 232 of the flanges 212. A wide range of electrically non-conductive materials can be coated or applied to the inner surface portions 232. In one particular embodiment, electrically non-conductive paint 228 is applied or coated to the inner surface portions 232 of the flanges 212. Alternative embodiments can use other suitable electrically non-conductive materials.

An exemplary method of making the gasket 200 will now be described for purposes of illustration only. In this example, electrically non-conductive paint 228 is coated or applied to the electrically-conductive material prior to stamping and forming the gasket 200. In this particular example, the electrically non-conductive paint 228 may be applied at a thickness of about 0.001 inch to 0.0015 inch to beryllium copper alloy, which has a thickness of about 0.002 inch. The electrically non-conductive paint is preferably only applied to those locations that will ultimately form the inner surfaces 232 of the flanges 212. The member 204 can then be formed by stamping the electrically-conductive material with the electrically non-conductive paint 228 thereon. For this example, the use of beryllium copper alloy can be advantageous in that it allows the gasket 200 to be formed without requiring any post heat treatment processing. In addition, the use of electrically non-conductive paint may be advantageous because it can be sprayed on, generally has excellent dielectric or non-conductive properties, and can withstand forming operations. Alternatively, the gasket 200 can be made from other electrically-conductive materials and/or from other electrically non-conductive materials.

By way of example, the gasket 200 may have the same dimensions and angular values that were given above for the gasket 100, which were provided as examples for purposes of illustration only. Alternatively, the gasket 200 can be configured with different dimensions and angles depending, for example, on the particular device in which the gasket 200 will be used.

In addition, the gasket 200 may be used in a similar manner as what is shown in FIGS. 7 through 10. For example, the gasket 200 can be positioned with the electrically-conductive lower surface 236 in contact with a board 170 (FIG. 7) of a fingerprint reader, thereby providing an electrostatic discharge path to ground. The inner surfaces 232 of the gasket flanges 212 can abut against sidewalls 124 of the fingerprint reader electronic scanning portion 120, whereby the inner flange surfaces 232 provide an electrically-insulative barrier. In this exemplary manner, the gasket 200 can thus protect the fingerprint reader from receiving an electrostatic discharge surge when the user's finger is placed in contact with the scanning surface of the fingerprint reader. Alternatively, the gasket 200 (as can gaskets 100 and 300, etc.) may instead be used with other fingerprint reader configurations and/or other electronic equipment vulnerable to ESD damage during use.

Figure 17:
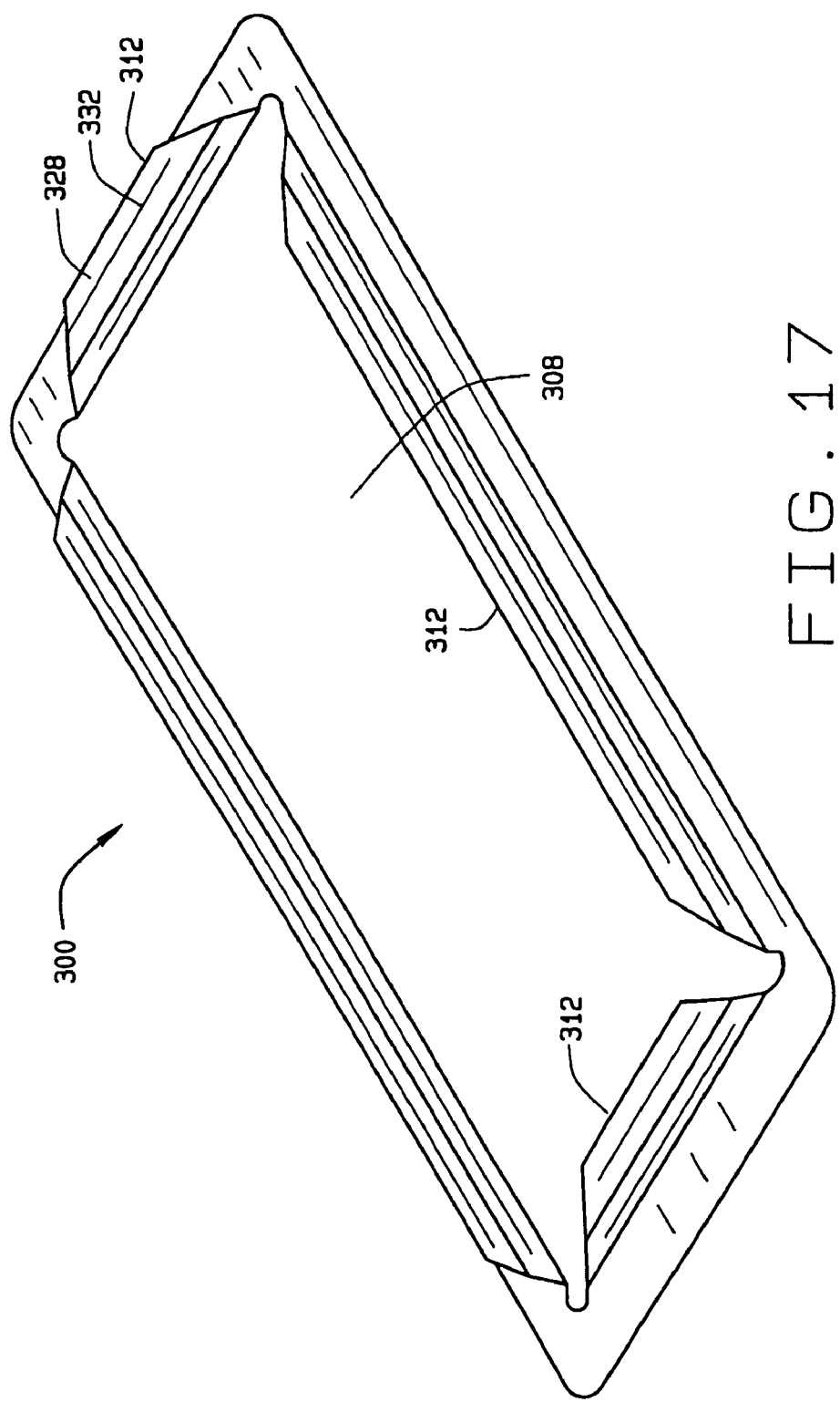
FIG. 17 is a perspective view of another exemplary embodiment of a gasket capable of protecting a fingerprint reader from receiving an electrostatic discharge surge when a user's finger is placed in contact with the electronic scanning portion of the fingerprint reader.
Figure 18:
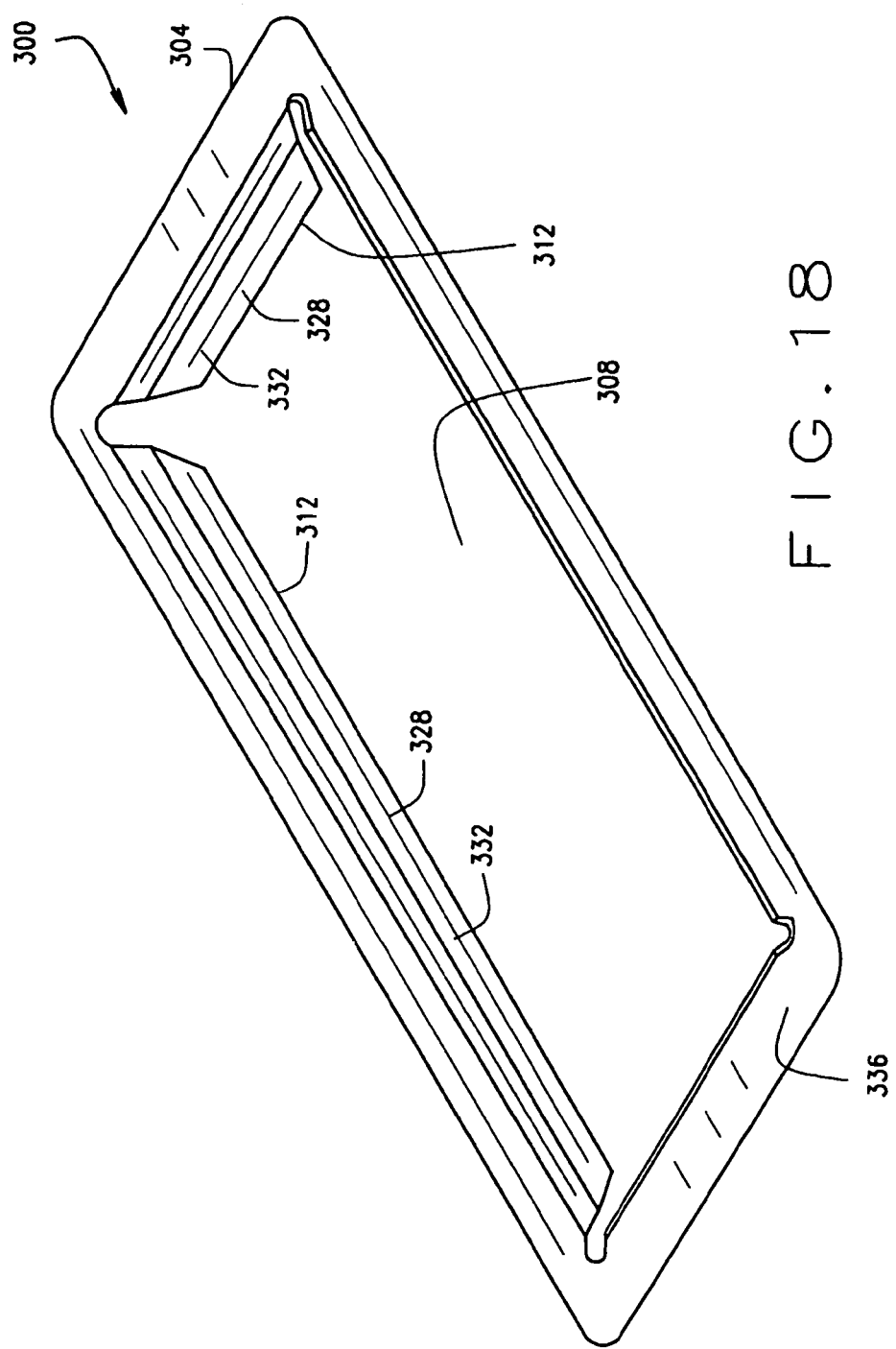
FIG. 18 is a lower perspective view of the gasket shown in FIG. 17.
Figure 19:
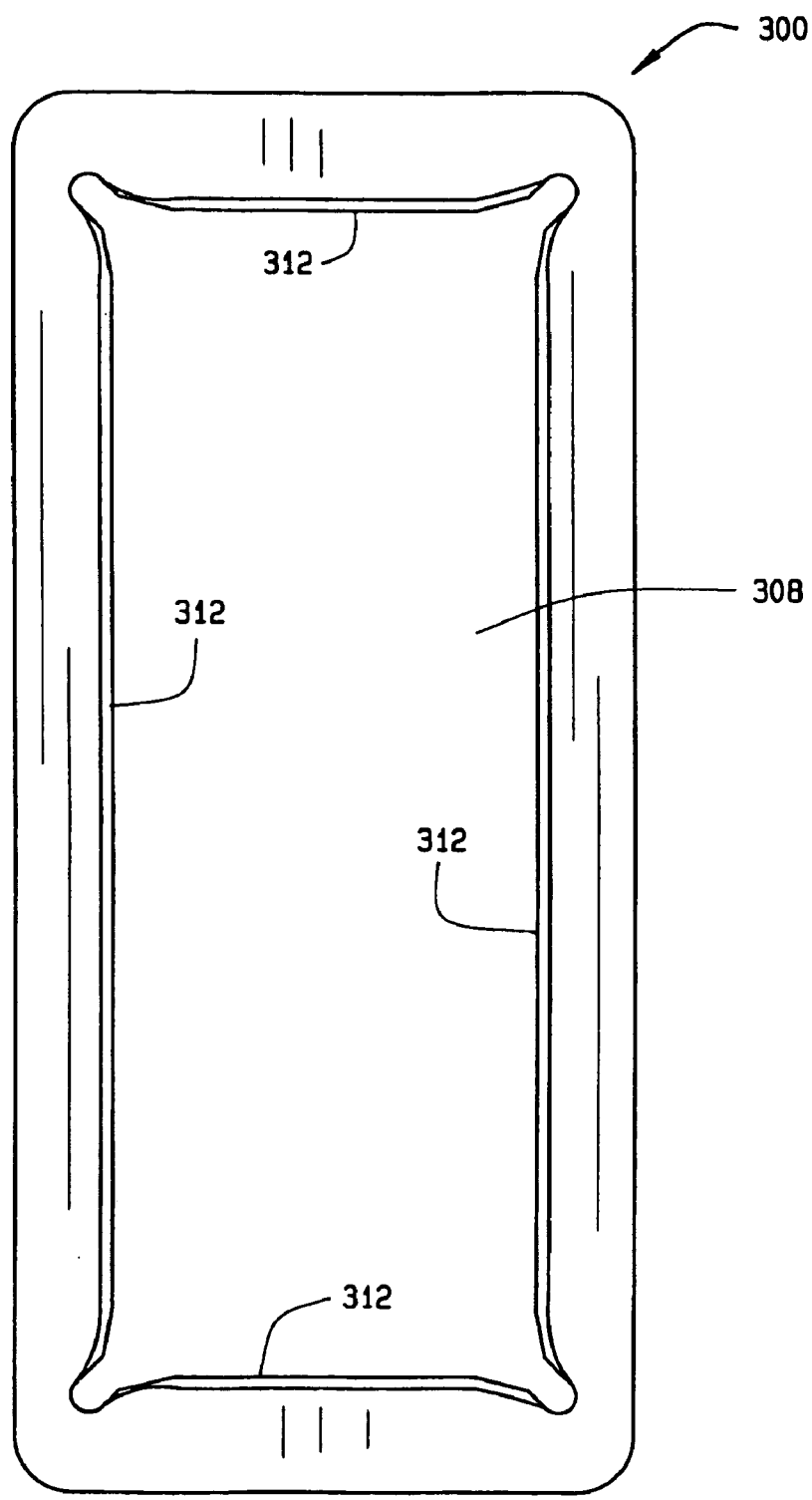
FIG. 19 is an upper plan view of the gasket shown in FIG. 17.
Figure 20:
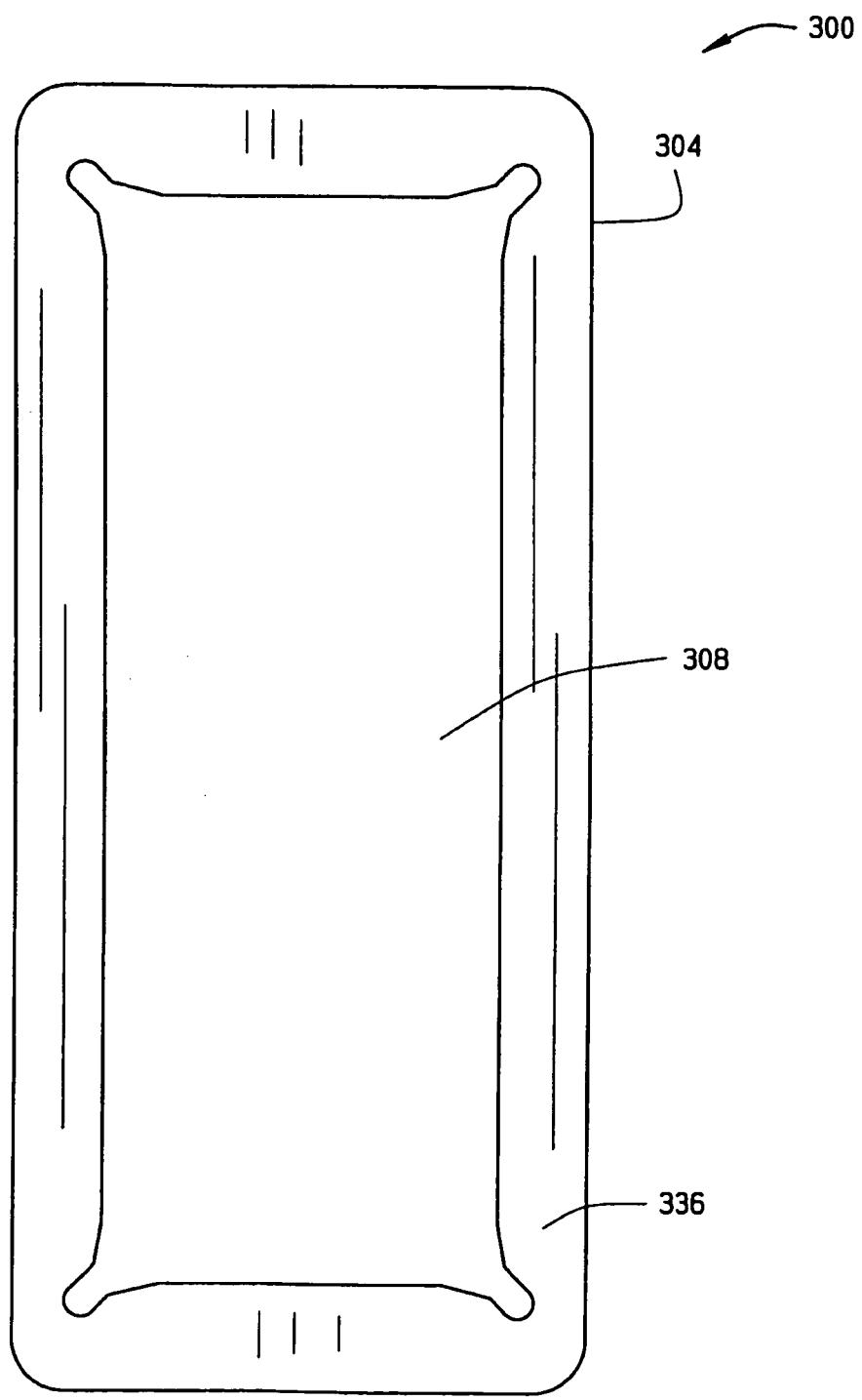
FIG. 20 is a lower plan view of the gasket shown in FIG. 17.
Figure 21:
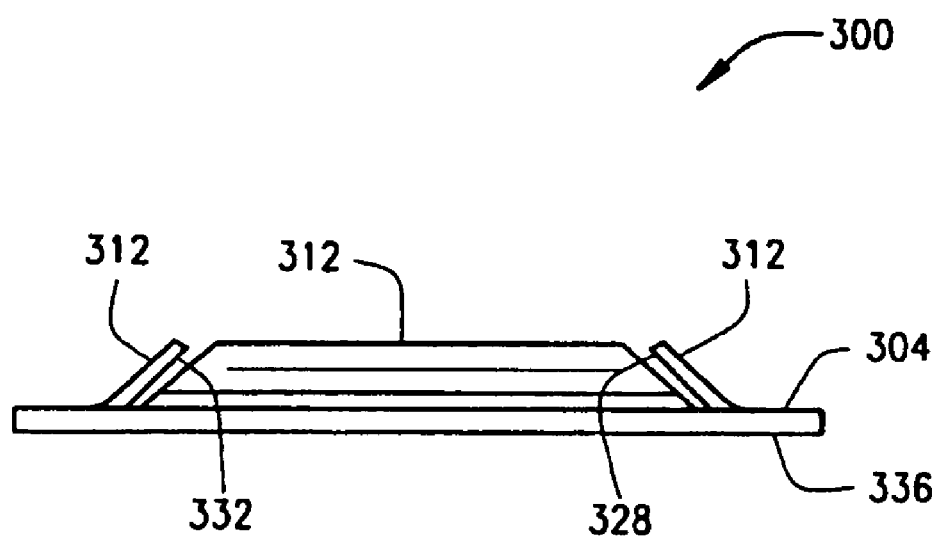
FIG. 21 is a front elevation view of the gasket shown in FIG. 17.
Figure 22:
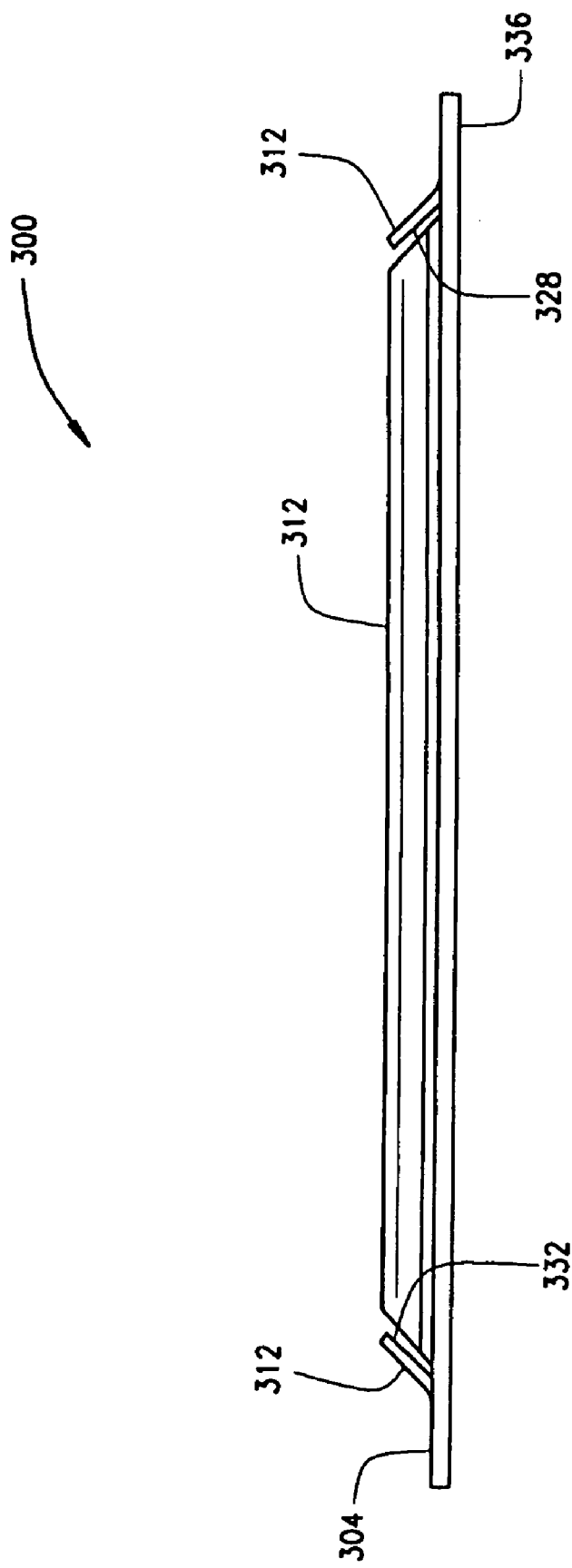
FIG. 22 is a side elevation view of the gasket shown in FIG. 17.

FIGS. 17 through 22 illustrate another exemplary embodiment of a gasket 300 embodying one or more aspects of the present disclosure. As shown in FIG. 17, the gasket 300 generally includes a member 304 having a window 308 therethrough. Flanges 312 extend generally upwardly about the window 308. While the member 304 and window 308 are generally rectangular in this embodiment, other configurations (e.g., shapes, sizes, etc.) are also possible for the member 304 and window 308. FIG. 18 is a lower perspective view of the gasket 300 further illustrating the flange inner surfaces 332, which may engage sidewalls of a fingerprint reader.

A wide range of materials can be used for the member 304, preferably electrically-conductive materials having sufficient resiliency or springiness for permitting the flanges 312 to be at least partially deflected during use. For example, this resiliency can allow the flanges 312 to deflect or flex outwardly, and then to respond with a sufficient restorative force for biasing the flanges 312 against a portion of the fingerprint reader (e.g., sidewalls 124 of the fingerprint reader electronic scanning portion 120, as shown in FIGS. 7, 9, and 10). This biasing force can help the flanges 312 maintain good contact with the fingerprint reader's sidewalls. Accordingly, the selection of the material for the member 304 and/or the flanges 312 can depend, for example, on the particular application and the deflection needs for maintaining good contact against the fingerprint reader.

In the illustrated embodiment, the member 304 is formed from a beryllium copper alloy. Alternatively, other suitable resilient or springy electrically-conductive materials can be used for the member 304.

The gasket 300 further includes an electrically non-conductive material disposed on the inner surfaces 332 of the flanges 312. A wide range of electrically non-conductive materials can be disposed on the inner surfaces 332. In one particular embodiment, an electrically non-conductive material (e.g., an electrically non-conductive Teflon® polytetrafluoroethylene (PFTE) material, etc.) is applied or sprayed onto the inner surfaces 332 of flanges 312. Alternative embodiments can use other suitable electrically non-conductive materials, beside Teflon® polytetrafluoroethylene (PFTE) material.

An exemplary method of making the gasket 300 will now be described for purposes of illustration only. In this example, electrically non-conductive Teflon® PFTE 328 is sprayed or applied to the electrically-conductive material prior to stamping and forming the gasket 300. In this particular example, the electrically non-conductive spray may be applied at a thickness of about ten microns to beryllium copper alloy, which may have a thickness of about 0.002 inch. The electrically non-conductive spray 328 is preferably applied only to those particular locations that will ultimately form the inner surfaces 332 of the flanges 312. The member 304 can then be formed by stamping the electrically-conductive material with the electrically non-conductive Teflon® PTFE 328 thereon. For this example, the use of beryllium copper alloy can be advantageous in that it allows the gasket 300 to be formed without requiring any post heat treatment processing. In addition, the use of electrically non-conductive Teflon® PTFE 328 spray may be advantageous because it can be sprayed on, has generally excellent dielectric or non-conductive properties, and can withstand typical forming operations. Alternatively, the gasket 300 can be made from other electrically-conductive materials and/or from other electrically non-conductive materials.

By way of example, the gasket 300 may have the same dimensions and angular values that were given above for the gasket 100, which were provided as examples for purposes of illustration only. Alternatively, the gasket 300 can be configured with different geometries, dimensions, and angles depending, for example, on the particular device in which the gasket 300 will be used.

In addition, the gasket 300 may be used in a similar manner as what is shown in FIGS. 7 through 10. For example, the gasket 300 can be positioned with the electrically-conductive lower surface 336 in contact with a board 170 (FIG. 7) of a fingerprint reader, thereby providing an electrostatic discharge path to ground. The inner surfaces 332 of the gasket flanges 312 can abut against sidewalls 124 of a fingerprint reader electronic scanning portion 120, whereby the inner flange surfaces 332 provide an electrically-insulative barrier. In this exemplary manner, the gasket 300 can thus protect the fingerprint reader from receiving an electrostatic discharge surge when the user's finger is placed in contact with the scanning surface of the fingerprint reader. Alternatively, the gasket 300 (as can gaskets 100 and 200, etc.) may instead be used with other fingerprint reader configurations and/or other electronic equipment vulnerable to ESD damage during use.

Advantageously, various embodiments can thus find usefulness in protecting fingerprint readers from receiving electrostatic discharge surges when a user's finger is placed in contact with an electronic scanning portion of the fingerprint reader. Gaskets of the present disclosure can also be used with other electronic equipment besides fingerprint readers. Accordingly, the specific references to fingerprint readers should not be construed as limiting the scope of the invention to use with only fingerprint readers.

In addition, some gasket embodiments can have a thickness no greater than about 0.0025 inch, for example, to facilitate the usage of the gasket in multiple fingerprint reader designs, and/or to allow fabrication of the gasket without plastic tooling.

Certain terminology is used herein for purposes of reference only, and thus is not intended to be limiting. For example, terms such as "upper", "lower", "above", "below", "front", "back", "rear", "bottom", and "side" can refer to directions in the drawings to which reference is made and/or can describe the orientation of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second" and other such numerical terms referring to structures do not imply a sequence or order unless clearly indicated by the context.

When introducing elements or features of the present disclosure and the exemplary embodiments, the articles "a", "an", "the" and "said" are intended to mean that there are one or more of such elements or features. The terms "comprising", "including" and "having" are intended to be inclusive and mean that there may be additional elements or features other than those specifically noted. It is further to be understood that the methods "steps", "processes", and "operations" thereof described herein are not to be construed as necessarily requiring their performance in the particular order discussed or illustrated, unless specifically identified as an order or performance. It is also to be understood that additional or alternative steps may be employed.

The description of the disclosure is merely exemplary in nature and, thus, variations that do not depart from the gist of the disclosure are intended to be within the scope of the disclosure. Such variations are not to be regarded as a departure from the spirit and scope of the disclosure.

What is claimed is:

1. A gasket suitable for use in protecting a fingerprint reader from receiving an electrostatic discharge when a user's finger is placed in contact with an electronic scanning portion of the fingerprint reader, the gasket comprising:
   a lower surface having at least one portion that is electrically-conductive;
   an opening; and
   one or more flanges having one or more inner flange surfaces, at least one portion of the one or more inner flange surfaces being electrically non-conductive;
   whereby the opening is configured to allow the gasket to be positioned generally about the electronic scanning portion with a path to ground for the electrostatic discharge being formed by the at least one electrically-conductive portion of the gasket's lower surface contacting a portion of the fingerprint reader, and with the at least one electrically non-conductive portion of the gasket's one or more inner flange surfaces forming an electrically-insulative barrier generally between the electronic scanning portion, the electrostatic discharge, and the at least one electrically-conductive portion of the gasket's lower surface.

2. The gasket of claim 1, wherein the gasket comprises an electrically-conductive resilient material, and wherein the at least one portion of the gasket's one or more inner flange surfaces comprises an electrically non-conductive material to thereby render said at least one portion electrically non-conductive.

3. The gasket of claim 2, wherein the electrically non-conductive material comprises at least one or more of:
an electrically non-conductive film with adhesive;
electrically non-conductive paint; and
electrically non-conductive polytetrafluoroethylene spray.

4. The gasket of claim 2, wherein the electrically-conductive resilient material comprises beryllium copper alloy.

5. The gasket of claim 2, wherein the electrically non-conductive material comprises Mylar® film.

6. The gasket of claim 1, wherein the gasket comprises a material having sufficient resiliency to permit outward flexing of the one or more flanges with a sufficient restorative force for biasing the one or more flanges against the electronic scanning portion.

7. The gasket of claim 1, wherein the one or more flanges are resiliently biased for maintaining abutting contact with the electronic scanning portion.

8. The gasket of claim 1, wherein the entire lower surface of the gasket is electrically conductive, and wherein the entire inner flange surfaces are electrically non-conductive.

9. The gasket of claim 1, wherein the gasket comprises a generally rectangular annular member that defines the opening to have a generally rectangular shape, and wherein the one or more flanges comprises four flanges each positioned along a different side of the generally rectangular opening.

10. A fingerprint reader comprising the gasket of claim 1.

11. A method of making a gasket for protecting a fingerprint reader from receiving an electrostatic discharge when a user's finger is placed in contact with an electronic scanning portion of the fingerprint reader, the method comprising:
applying an electrically non-conductive material to an electrically-conductive resilient material; and
forming the electrically-conductive material with the electrically non-conductive material thereon to form a gasket including a lower surface having at least one portion that is electrically-conductive, an opening, and one or more flanges having one or more inner flange surfaces that include at least one portion with the electrically non-conductive material;
wherein the opening is configured to allow the gasket to be positioned generally about the electronic scanning portion with a path to ground for the electrostatic discharge being formed by the at least one electrically-conductive portion of the gasket's lower surface contacting a portion of the fingerprint reader, and with the at least one electrically non-conductive portion of the gasket's one or more inner flange surfaces forming an electrically-insulative barrier generally between the electronic scanning portion, the electrostatic discharge, and the at least one electrically-conductive portion of the gasket's lower surface.

12. The method of claim 11, wherein the electrically-conductive member comprises beryllium copper alloy.

13. The method of claim 11, wherein applying the electrically non-conductive material comprises at least one or more of:
adhesively attaching electrically non-conductive film to the electrically-conductive resilient material;
applying electrically non-conductive paint to the electrically-conductive resilient material; and
applying electrically non-conductive polytetrafluoroethylene spray to the electrically-conductive resilient material.

14. The method of claim 11, wherein applying the electrically non-conductive material comprises adhesively attaching Mylar® film to the electrically-conductive resilient material.

15. The method of claim 11, wherein forming comprises forming the one or more flanges such that the one or more flanges are resiliently biased for maintaining good abutting contact with the electronic scanning portion.

16. The method of claim 11, wherein the electrically-conductive material has sufficient resiliency to permit outward flexing with a sufficient restorative force for biasing the one or more flanges against the electronic scanning portion.

17. The method of claim 11, wherein applying an electrically non-conductive material comprises laminating an electrically non-conductive material to the electrically-conductive resilient material, and wherein forming includes stamping the electrically-conductive material having the electrically non-conductive material laminated thereon.

18. The method of claim 11, wherein applying an electrically non-conductive material comprises applying an electrically non-conductive film to the electrically-conductive resilient material using a pressure sensitive adhesive, and wherein forming includes stamping the electrically-conductive material having the electrically non-conductive film laminated thereon to form the gasket without any post heat treatment processing.

19. A method of protecting a fingerprint reader from receiving an electrostatic discharge when a user's finger is placed in contact with an electronic scanning portion of the fingerprint reader, the method comprising:
positioning a gasket generally about the electronic scanning portion, the gasket including a lower surface having at least one portion that is electrically-conductive, an opening, and one or more flanges having one or more inner flange surfaces, at least one portion of the one or more inner flange surfaces being electrically non-conductive, the positioning of the gasket including:
receiving the electronic scanning portion within the gasket's opening;
forming a path to ground for the electrostatic discharge by contacting the at least one electrically-conductive portion of the gasket's lower surface with a portion of the fingerprint reader; and
forming an electrically-insulative barrier, with the electrically non-conductive inner flange surfaces, generally between the electronic scanning portion, the electrostatic discharge, and the at least one electrically-conductive portion of the gasket's lower surface.

20. A gasket comprising a resilient member having an electrically-conductive lower surface, an opening, and one or more flanges extending generally upwardly relative to the electrically-conductive lower surface about the opening, the one or more flanges having one or more electrically non-conductive inner flange surfaces, the opening configured to allow the gasket to be positioned generally about a portion of an electronic device with a path to ground for an electrostatic discharge being formed by the gasket's electrically-conductive lower surface contacting a portion of the electronic device, and with the electrically non-conductive inner flange surfaces forming an electrically-insulative barrier generally between the portion of the electronic device about which the gasket is positioned, the electrostatic discharge, and the gasket's electrically-conductive lower surface.

21. The gasket of claim 20, wherein the resilient member comprises an electrically-conductive resilient material, and wherein an electrically non-conductive material is provided to the inner flange surfaces to thereby render the inner flange surfaces electrically non-conductive.

22. The gasket of claim 21, wherein the electrically non-conductive material comprises at least one of:
   an electrically non-conductive film with adhesive;
   electrically non-conductive paint; and
   electrically non-conductive polytetrafluoroethylene spray.

23. The gasket of claim 21, wherein the electrically non-conductive material comprises Mylar® film.

24. The gasket of claim 20, wherein the resilient member comprises a material having sufficient resiliency to permit outward flexing of the one or more flanges with a sufficient restorative force for biasing the one or more flanges against the electronic scanning portion.

25. The gasket of claim 20, wherein the one or more flanges are resiliently biased for maintaining abutting contact with a portion of the electronic device.

26. The gasket of claim 20, wherein the gasket includes a length L of about 0.65 inch, a width W of about 0.28 inch, a radius of curvature R1 of about 0.008 inch, a radius of curvature R2 of about 0.02 inch, an angle A of about seventy-five degrees, a width W2 of about 0.202 inch, a width W3 of about 0.04 inch, a radius of curvature R3 of about 0.008 inches, a height H of about 0.028 inch, a length L2 of about 0.548 inch, a length L3 of about 0.05 inch, and an angle B of about seventy-five degrees.

27. A gasket suitable for use in protecting a fingerprint reader from receiving an electrostatic discharge when a user's finger is placed in contact with an electronic scanning portion of the fingerprint reader, the gasket comprising:
   a lower surface having at least one portion that is electrically-conductive;
   an opening; and
   one or more flanges having one or more inner flange surfaces, at least one portion of the one or more inner flange surfaces being formed to have at least a predetermined angle, and made of an electrically non-conductive material having sufficient resiliency, so as to permit outward flexing of the one or more flanges with a sufficient restorative force for biasing the one or more flanges against the electronic scanning portion, to thereby maintain adequate contact between the electrically non-conductive portion of the inner flange surface and the electronic scanning portion;
   whereby the opening is configured to allow the gasket to be positioned generally about the electronic scanning portion with a path to ground for the electrostatic discharge being formed by the at least one electrically-conductive portion of the gasket's lower surface contacting a portion of the fingerprint reader, and with the at least one electrically non-conductive portion of the gasket's one or more inner flange surfaces forming an electrically-insulative barrier generally between the electronic scanning portion, the electrostatic discharge, and the at least one electrically-conductive portion of the gasket's lower surface.

28. The gasket of claim 27, wherein at least one portion of the one or more inner flange surfaces are formed to at a predetermined angle of seventy-five degrees.

* * * * *